United States Patent
Niu et al.

(10) Patent No.: US 6,327,603 B1
(45) Date of Patent: Dec. 4, 2001

(54) DIGITAL CHANNELIZER HAVING EFFICIENT ARCHITECTURE FOR PRESUM DISCRETE FOURIER TRANSFORMATION SELECTIVELY OF REAL OR COMPLEX DATA AND METHOD OF OPERATION

(75) Inventors: Edward L - C. Niu; Charlotte N. Carpenter, both of Redondo Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/259,127

(22) Filed: Feb. 26, 1999

(51) Int. Cl.[7] ................................................. G06F 17/14
(52) U.S. Cl. ............................................ 708/405; 708/403
(58) Field of Search .................................... 708/400–405

(56) References Cited

U.S. PATENT DOCUMENTS

| | | | |
|---|---|---|---|
| 4,164,021 | * 8/1979 | Nishitani et al. | 708/405 |
| 4,223,185 | * 9/1980 | Picon | 708/404 |
| 4,748,579 | * 5/1988 | Zibman et al. | 708/405 |
| 4,970,674 | * 11/1990 | White | 708/405 |

OTHER PUBLICATIONS

Multirate Signal Processing, pp. 289–325, by Crochiere and Rabiner, published in 1983 by Prentice Hall, Englewood Cliffs, New Jersey.

"Applications of Distributed Arithmetic to Digital Signal Processing: A Tutorial Review", IEEE ASSP Magazine, Jul. 1989, pp. 4–19.

"Partial FFT Evaluation" by Julio Cezar David de Melo, pp. 137–141, Proceedings of the International Conference on Signal Processing Applications and Technology (ICSPAT), 1996, Algorithm Implementation Section.

\* cited by examiner

Primary Examiner—Tan V. Mai
(74) Attorney, Agent, or Firm—Antonelli, Terry, Stout & Kraus, LLP

(57) ABSTRACT

A digital channelizer and a process for dividing an input bandwidth into at least some of N channels are disclosed. A digital channelizer which divides an input bandwidth into channels in accordance with the invention includes a window presum (102), responsive to input data, which outputs real or complex data; a cyclic shift (24'), coupled to the real or complex data outputted from the window presum, which outputs real or complex data which is shifted relative to data outputted from the window presum; and an N point discrete Fourier transform apparatus (26'), coupled to the shrifted real or complex data, which in response to a command performs a discrete Fourier transform on inputted shifted real or inputted shifted complex data to produce the channels, the discrete Fourier transform apparatus performing a transformation of the inputted cyclic shifted real data when the command specifies processing of the shifted real data and performing a transformation of the inputted complex data when the command specifies processing of the inputted cyclic shifted complex data. The N point discrete Fourier transform includes an input discrete Fourier computation stage having two N/2 point discrete Fourier transforms and an output discrete Fourier computation stage having N/2 two point discrete Fourier transforms.

9 Claims, 23 Drawing Sheets

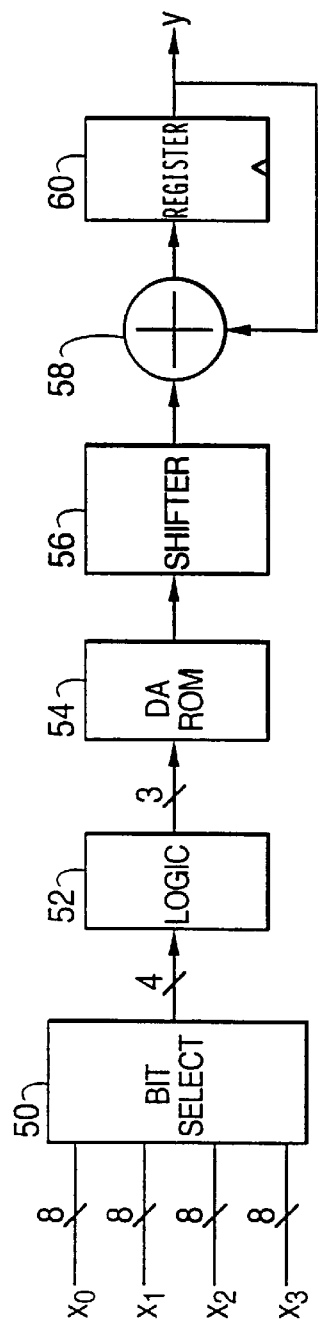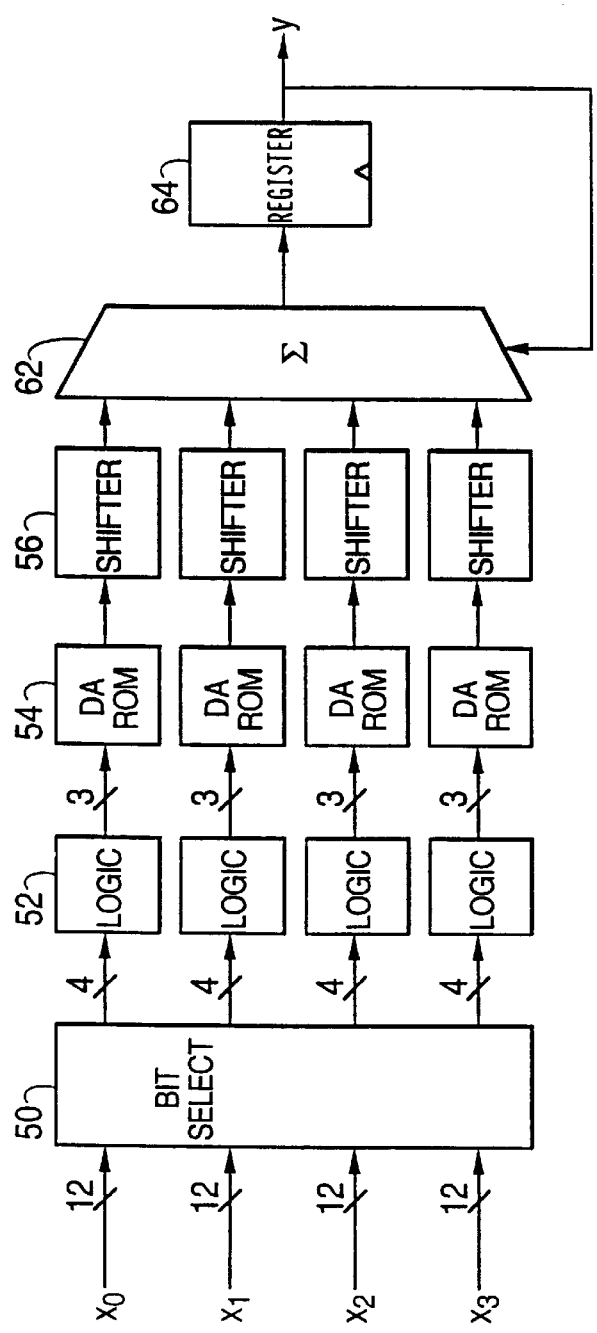
*FIG. 6 (PRIOR ART)*
*FIG. 7 (PRIOR ART)*

FIG. 19

EXAMPLE:

M=15, N=24
GCD(15,24)=3
Q=N/GCD (15,24) = 8

| Wp = | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| CYCLE 1 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
| CYCLE 2 | 15 | 16 | 17 | 18 | 19 | 20 | 21 | 22 | 23 | 0 | 1 | 2 | 3 | 4 | 5 | 6 | 7 | 8 | 9 | 10 | 11 | 12 | 13 | 14 |
| CYCLE 3 | 6 | 7 | 8 | 9 | 10 | 11 | 12 | 13 | 14 | 15 | 16 | 17 | 18 | 19 | 20 | 21 | 22 | 23 | 0 | 1 | 2 | 3 | 4 | 5 |
| CYCLE 4 | 21 | 22 | 23 | 0 | 1 | 2 | 3 | 4 | 5 | 6 | 7 | 8 | 9 | 10 | 11 | 12 | 13 | 14 | 15 | 16 | 17 | 18 | 19 | 20 |
| CYCLE 5 | 12 | 13 | 14 | 15 | 16 | 17 | 18 | 19 | 20 | 21 | 22 | 23 | 0 | 1 | 2 | 3 | 4 | 5 | 6 | 7 | 8 | 9 | 10 | 11 |
| CYCLE 6 | 3 | 4 | 5 | 6 | 7 | 8 | 9 | 10 | 11 | 12 | 13 | 14 | 15 | 16 | 17 | 18 | 19 | 20 | 21 | 22 | 23 | 0 | 1 | 2 |
| CYCLE 7 | 18 | 19 | 20 | 21 | 22 | 23 | 0 | 1 | 2 | 3 | 4 | 5 | 6 | 7 | 8 | 9 | 10 | 11 | 12 | 13 | 14 | 15 | 16 | 17 |
| CYCLE 8 | 9 | 10 | 11 | 12 | 13 | 14 | 15 | 16 | 17 | 18 | 19 | 20 | 21 | 22 | 23 | 0 | 1 | 2 | 3 | 4 | 5 | 6 | 7 | 8 |

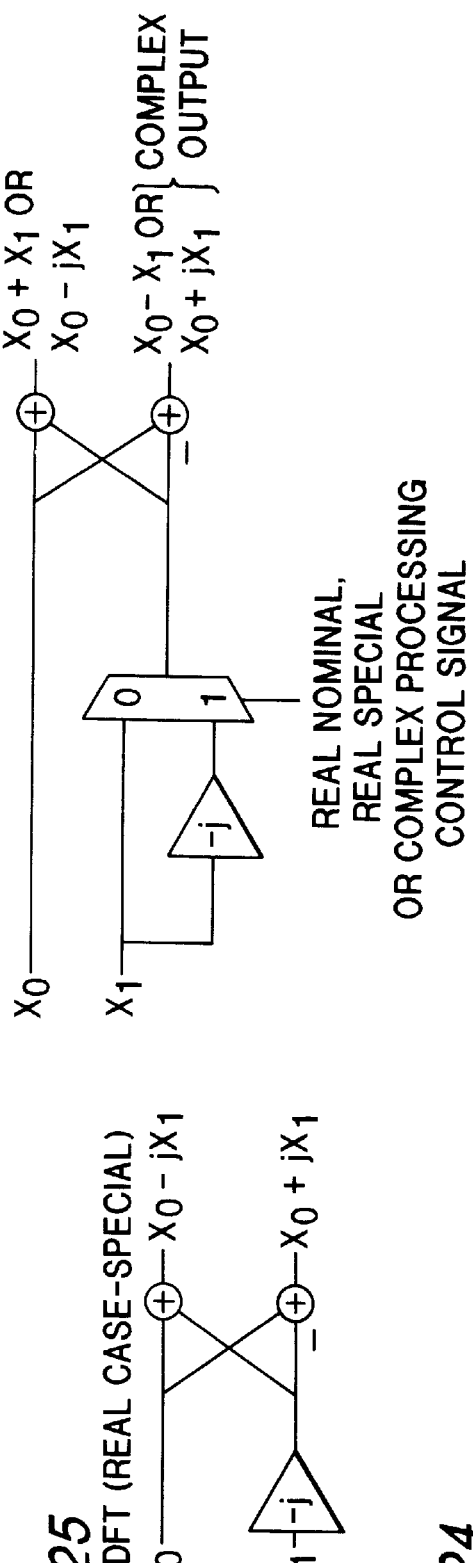
FIG. 26
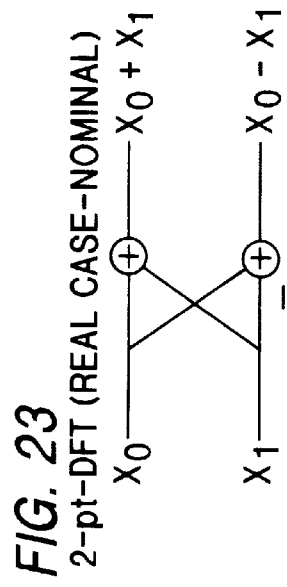
FIG. 23
2-pt-DFT (REAL CASE-NOMINAL)
FIG. 25
2-pt-DFT (REAL CASE-SPECIAL)
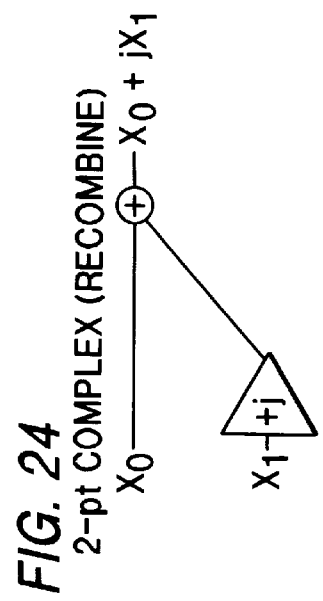
FIG. 24
2-pt COMPLEX (RECOMBINE)

DIGITAL CHANNELIZER HAVING EFFICIENT ARCHITECTURE FOR PRESUM DISCRETE FOURIER TRANSFORMATION SELECTIVELY OF REAL OR COMPLEX DATA AND METHOD OF OPERATION

CROSS-REFERENCE TO RELATED APPLICATIONS

Reference is made to the following patent applications which are filed on even date herewith and which are incorporated herein by reference in their entirety:

(1) U.S. application Ser. No. 09/259,031, entitled "Digital Channelizer Having Efficient Architecture For Window Presum Operation and Method of Operation Thereof";

(2) U.S. application Ser. No. 09/259,623, entitled "Digital Channelizer Having Efficient Architecture For Discrete Fourier Transformation and Operation Thereof";

(3) U.S. application Ser. No. 09/258,847, entitled "Digital Channelizer Having Efficient Architecture For Cyclic Shifting and Method of Operation Thereof", (4) U.S. application Ser. No. 09/259,030, entitled "Digital Channelizer Having Efficient Architecture For Window Presum Using Distributed Arithmetic for Providing Window Presum Calculations in One Clock Cycle"; and (5) U.S. application Ser. No. 09/259,029, entitled "Efficient Digital Channelizer System and Method of Operation Thereof".

BACKGROUND OF THE INVENTION

1. Field of the Invention

The present invention relates to filters for dividing an input bandwidth into a plurality of channels and more particularly, to a digital channelizer for satellite communication applications using discrete Fourier transformation (DFT) to divide the input bandwidth into channels.

2. Description of the Prior Art

Digital channelizers in satellite communication systems have several design constraints. High computation complexity is required which requires highly complex integrated circuit logic function and interconnections. High power consumption by integrated circuits can lead to high operating temperatures which could contribute to channelizer malfunction or failure. The system clock rate is required to be sufficiently high to support a high data throughput but should be as low as possible to lessen power consumption which contributes to the aforementioned possible high operating temperatures. The power consumption of a digital channelizer is proportional to the clock rate and the type of integrated circuits which implement the required high computational complexity. Furthermore, excess hardware can interfere with processing efficiency and be a source of potential malfunction.

FIG. 1 illustrates a block diagram of a prior art digital channelizer 10 which functions as a down converter and filter which divides a wideband input bandwidth into a plurality of equally spaced channels. The channelizer 10 is representative of channelizers using DFT which have been described in the literature. See Multirate Digital Signal Processing, published in 1983 by Prentice Hall, Englewood Cliffs, N.J., written by Crochiere and Rabiner, which publication is incorporated herein by reference in its entirety. Such systems have applications in wideband satellite communication systems.

The INPUT signal is applied to a bandpass filter 12 which passes a selected wide bandwidth for division into N equally spaced channels each of a narrower bandwidth. For example, a wideband signal of 320 MHz. may be passed by the bandpass filter 12 for division into sixteen 20 MHz. wide channels. The bandpass filtered signal is applied to analog to digital converter 14 which samples the bandpass filtered signal. A representative frequency spectrum resultant from sampling is described further below in conjunction with FIGS. 3A and 3B. Each sample is comprised of a multiple bit word. A serial stream of multiple bit words is outputted by the analog to digital converter 14 as an input to demultiplexer 16 which produces D outputs 18. The variable D may equal the variable M known as the decimation rate. The demultiplexer 16 functions as a multiple tapped delay line with each parallel output being outputted from a different tap of the delay line. The D outputs 18 of the demultiplexer are applied to window presum computer 20. The window presum computer 20 functions in a well-known manner to process the sequence of words within a window of L words by multiplying each corresponding word in a plurality of equal subparts R of the window containing N words by a window presum function coefficient and summing the resultant multiplication products to produce the sum of the multiplication products where R=L/N. The individual summed multiplication products, after further processing including DFT as described below, are outputted as individual ones of the N channels. The number of outputted channels may be selected to be less than N.

For example, a sequence of ninety-six words, outputted by the demultiplexer 16, is broken up into four subparts each containing twenty-four words. Each of R corresponding words, e.g. words 0, 24, 48 and 72, from a different subpart, are multiplied by their preassigned window presum function coefficient and summed to produce an output summation which is subsequently processed into one of the N output channels. The window presum computer 20 has D inputs and N outputs. The relationship between M, D and N, which is the DFT size and the number of possible channels, affects the architecture of the window presum computer 20. Words stored in a number of registers (not illustrated), e.g. words 0, 24, 48 and 72, equal to the R subparts in the window processed by the window presum computer 20, are summed after multiplication by their preassigned window presum function coefficient to produce the output summation.

The window presum computer 20 has been implemented by the Assignee with parallel data processing paths using integrated circuits with M not being equal to N. The number of processing paths I used by the Assignee to perform parallel data processing satisfies the relationship I equals the greatest common divisor of N and M which is expressed hereafter as GCD (N,M).

The N outputs from the window presum computer 20 are applied to a cyclic shift 24, which provides phase adjustment, for processing into each channel by DFT. The phase produced by the cyclic shift 24 is applied to the resultant N word outputs from the window presum computer by a calculated number of shifts. The operation of cyclic shifting is well known and is, for example, described in the aforementioned publication on pp. 320–323. The number of shifts of the output words of the window presum computer 20 by the cyclic shift 24 is determined by computing the value of the relationship mM*modulo N or −mM*modulo N. The variable m is an output index variable which ranges from zero upward to positive integers. The output from the cyclic shift 24, which has N channels, is applied to a discrete Fourier transform apparatus 26 having N inputs which transforms the output from the cyclic shift 24 into the N output channels.

FIG. 2 illustrates a conceptual block diagram of the window presum algorithm which represents the window presum processing performed by the system of FIG. 1. The sampled output of L individual words is shifted into a shift register which stores the sequential words outputted by the analog to digital converter 14. The input data are shifted into the shift register, which has a number of subparts R, e.g. 4 in the above example. The number of words per subpart (the DFT size) is equal to the number N of output channels. The shift register has an analysis window L words long which is R times the size N of the discrete Fourier transform. The sum of the individual R subparts contains the words which are further processed to individual channels by DFT. The data in the shift register are weighed with a time reverse window according to equation 7.70 on page 317 of the aforementioned publication to produce a windowed sequence as illustrated. The sequence is processed as blocks of samples starting at r=0 which are time aliased. The resultant summation is processed by a cyclic shift 24 through a number of shifts equal to mM*modulo N or -mM*modulo N and is applied to discrete Fourier transform 26.

The analog to digital converter 14 of FIG. 1, in accordance with digital sampling theory, produces a spectrum of frequency domain signals centered about zero frequency as illustrated in FIGS. 3A and 3B which respectively illustrate groups of twelve and twenty four frequency domain signals. The sampling frequency of fs for real signals produces counterpart frequency domain signals centered about the zero frequency extending to $f_s/2$ in both the positive (real) and negative (conjugate) frequencies. The positive frequencies may be expressed mathematically as a=x+iy and the negative frequencies may be expressed as a=x-iy with corresponding positive and negative frequencies being conjugates of each other. Also, in accordance with digital sampling theory, the frequency domain signals of FIGS. 3A and 3B repeat periodically with a period $f_s$ for successively higher positive frequencies and successively lower negative frequencies. These upper repeating frequency domain signals have been omitted from the illustration. The counterpart frequency domain signals of FIG. 3A are 1 and 11, 2 and 10, 3 and 9, 4 and 8, and 5 and 7, and the counterpart channels of FIG. 3B are 1 and 23, 2 and 22, 3 and 21, 4 and 20, 5 and 19, 6 and 18, 7 and 17, 8 and 16, 9 and 15, 10 and 14 and 11 and 13. Frequency domain signals 0 and 6 in FIG. 3A and 0 and 12 in FIG. 3B do not have counterparts. The information of each frequency domain signal is transformed to its counterpart conjugate by a sign reversal of the imaginary term iy.

FIG. 4A illustrates a diagram of the window presum function of a window containing forty eight (L) real words having four (R) subparts each containing 12(N) real words and FIG. 4B illustrates a window presum function of a window containing twenty four complex words containing an imaginary part identified by the letter "i" following a number and a real part identified by the letter "r" following a number. The window presums are identical except that the window presum function of FIG. 4B has half as many words in view of each word having a real and a imaginary part. Complex data in FIG. 4B is, for example, obtained when conversion of a spread spectrum transmission is down converted in the tuner of the receiver. The individual words of FIGS. 4A and 4B are multiplied by their preassigned window presum function coefficients and subsequently summed with other products of corresponding words from other subparts to produce the output of the window presum computation which is subsequently processed into N channels by DFT.

Corresponding words in each subpart R are summed to produce a number of sums equal to the number of words per window, e.g. P0–P11 or $P0_r$–$P5_i$. The summations P0–P11 and $P0_r$–$P5_i$; are processed with the window multiplication process by the use of stored coefficients to compute a value of y for each of the N channels which represents the summation of products which is applied to the cyclic shift 24.

The summation process, when the rate of decimation M is equal to the number of channels N, may be implemented efficiently with an array of registers storing the individual words identified in the vertical columns of FIG. 4A to produce the outputs P0–P11.

The summation of the products of corresponding individual words (e.g. 0, 12, 24 and 36 in FIG. 4A or word parts 0r, 6r, 12r and 18r in FIG. 4B) times their preassigned window presum function coefficients may be implemented in a number of ways. One method is illustrated in FIG. 5 which has the disadvantage of using substantial hardware requiring multipliers 40 and summation calculation 42. The number of multipliers 40 is equal to R and the number of adders in summation calculation 42 is equal to (R-1) in the worst case. This method computes the output summation y in one clock cycle (pipelined). The word values $x_o$, $x_1$, $x_2$, and $x_3$ represent corresponding word values from each of the R subparts of the window which is L words in length, e.g. words 0, 12, 24 and 36 in FIG. 4A or real word parts $O_r$, 6r, 12r and 18r in FIG. 4B. While this implementation for computing the summation y is computationally fast, it has the disadvantage of requiring a substantial number of gates, other hardware and interconnections which have the disadvantages described above especially in an environment involving satellites.

FIG. 6 illustrates a block diagram of a finite impulse response filter proposed in "Applications of Distributed Arithmetic to Digital Signal Processing: A Tutorial Review", by Stanley A. White, in IEEE ASSP Magazine, July 1989, pp. 1–19. The illustrated filter computes the summation y with an input of four eight bit words $x_0$, $x_1$, $x_2$ and $x_3$ in a serial fashion requiring eight clock cycles to process eight bit words. The overall operation is to compute individual products of input words $x_0$, $x_1$, $x_2$ and X3 and their multiplying window coefficients $W_0$, $W_1$, $W_2$, and $W_3$ to generate a sum $\Sigma_i x_i W_i$. The individual products are not computed in isolation and then added. Each bit of every word determines whether to add or subtract a multiple of their respective window coefficients, and all the bits at the same position within the words are processed at the same time, The result is that the overall sum of products is generated not by simply summing up products, but by summing multiples of different sum combinations of window coefficients and their negations. The bit select 50 selects bit slices from the eight bit words, e.g. the bits of the least significant bit LSB in ascending order to the most significant bit MSB. The logic circuit 52 exploits symmetry in the DA ROM 54 to eliminate half of the values that need to be stored for distributed arithmetic to operate correctly as a process. The process of reducing the number of bits is described on pages 5 et. seq. in the aforementioned paper. The DA (distributed arithmetic) ROM 54 stores all the possible sum combinations of window coefficients and their negations. The bit slice from the input words act as the address into the DA ROM 54 to choose the prolper sum of coefficients. The shifter 56 outputs the proper multiple by a power of two of the DA ROM output to the adder 58. The output of shifter 56 is applied to a summation calculation 58 which sums multiples of different sum combinations of window coefficients and their negations. Feedback from register 60 provides the current sum which is summed with the new sum by summation calculation 58 for each successive bit slice.

The serial implementation of FIG. 6 suffers from the disadvantage of requiring a high clock rate to compute the summation y for large data words. A high clock rate in satellite applications requires high energy consumption which can cause heating in integrated circuits and for systems requiring high data rates, represents a potential speed processing barrier. Processing one bit at a time has undesirable latency.

FIG. 7 illustrates an implementation of distributed arithmetic used by the Assignee in the window presum computer 20 to sum the products of the corresponding words and their preassigned window presum function coefficient. This system performs processing similar to FIG. 6, except that three clock cycles are used to respectively process four bit nibbles, which are inputted from twelve bit words $x_0$, $x_1$, $x_2$ and $x_3$. The processing of the four bit nibbles is in parallel but otherwise is analogous to FIG. 5. The summation calculation 62 sums for each of the three clock cycles the outputs from the shifters 56. Register 64 stores the resultant summation outputted by summation calculation 62 and feeds the summation back to the summation calculation to sum the current summation with the summation of the next clock cycle processing.

This implementation of distributed arithmetic has disadvantages for high word processing throughputs. It requires a higher clock rate to process the four bit nibbles in three cycles for each word which increases energy consumption when compared to processing all the bits of the word in one cycle. The clock rate required to perform three processing cycles per word could, for certain satellite processing applications, limit the word processing throughput below that which is required for a desired system performance.

Window presum computers 20 are well known which utilize an array of registers to store words $x_0$, $x_1$, $x_2$ and $x_3$ processed in accordance with the aforementioned processes for computing the summation y. Some applications have their decimation rate M equal to the DFT size N and the number of channels which are outputted. However, the Assignee has implemented a window presum calculator 20 having the decimation rate M not equal to the DFT size N. These systems provide the corresponding input words from each of the aforementioned subparts of the window, e.g. words 0, 12, 24 and 36 from FIG. 4A or corresponding parts of words from FIG. 4B from storage in registers for multiplication and summation to produce the output y of the window presum computer for each of the N channels.

Dicsrete Fourier transform are well known. A stand alone discrete Fourier transform apparatus of N inputs provides a frequency response at N outputs at specific equidistant frequencies. The N inputs are time domain signals and the N outputs are frequency domain signals determined at singular frequencies. The discrete Fourier transform apparatus itself can extract channel information, although it samples at only a singular frequency that represents the channel information.

In a channelizer, an output does provide a single extracted channel. The N outputs correspond to N time domain signals that each contain information from one of N frequency bands (equal in bandwidth) that divide the input signal frequency spectrum. This does not exclude the input signal from having more or fewer channels than N. The spectrum is simply divided into N frequency bands. All N inputs are required in the computation for every one of the N outputs and each of the N outputs represents the time-domain signal of one of the frequency bands dividing the frequency spectrum.

FIG. 8 is a diagram representing a prior art discrete Fourier transform device 118 which converts the output of twelve cyclically shifted summations y, produced by the cyclic shift 24, into twelve frequency domain outputs. Various algorithms are known for computing a DFT. The Winograd algorithm used for non-power of two discrete Fourier transforms is used in FIG. 8. The DFT apparatus 118 has twelve time domain inputs "in 0–in11" each representing multiple bit words and twelve frequency domain outputs "out 0–out11" each representing multiple bit channel outputs 0–11. Some of the outputs, which are represented in FIG. 8 as real numbers, in fact are complex numbers containing a real term and an imaginary term. The illustration of complex input words has been omitted in order to simplify illustration.

The discrete Fourier transform apparatus 118 includes an input discrete Fourier transform computation stage 120 comprised of six two point DFT's 122 of known construction each having a pair of time domain inputs and a pair of frequency domain outputs, an intermediate discrete Fourier transform computation stage 124 comprised of four three point DFTs 126 of known construction each having three inputs and three outputs and an output discrete Fourier transform computation stage 128 comprised of six two point DFTs 130 of known construction each having two inputs and producing two frequency domain outputs. The outputs of the two point DFTs 122 are inputs to the individual DFTs 126 of the intermediate discrete Fourier transform computation stage 124 and the outputs of the three point DFTs 126 of the intermediate discrete Fourier transform computation stage are inputs to the individual discrete Fourier transforms 130 of the output discrete Fourier transform computation stage 128.

FIG. 9 illustrates a prior art pruned discrete Fourier transform apparatus 140 which is representative of modifications performed by the Assignee to eliminate unnecessary DFTs 130 in the output discrete Fourier transform computation stage 128 when all of the N possible frequency domain outputs, equal to the number of time domain inputs, are not needed for further processing. The discrete Fourier transform 118 of FIG. 8 has been modified in FIG. 9 to eliminate two output stages 130 in view of only frequency domain signals 2, 3, 4, 5 and 8, 9, 10 and 11 representative of the frequency domain signals of FIG. 3A being required for further processing. The two point discrete Fourier transforms 130 which produce frequency domain signals 0 and 6 and 1 and 7 have been eliminated. The pairs of frequency domain inputs 0 and 6 and 1 and 7 are not represented. Output 5 is a counterpart and conjugate of output 7. However, output 5 in FIG. 9 is not further processed downstream in place of output 7.

FIG. 10 illustrates another form of prior art discrete Fourier apparatus 300 having all possible frequency domain signals as outputs. The frequency domain input discrete Fourier computation stage 302 has three four point discrete Fourier transforms 304 of known construction which each have four time domain inputs and four outputs which respectively are coupled to an output discrete Fourier transform computation stage 304 having four three point DFTs 306. This structure does not have an intermediate discrete Fourier computation stage like FIGS. 8 and 9.

FIG. 11 is a diagram representing a prior art discrete Fourier transform apparatus 400 which is twenty four time domain inputs and all of the possible twenty four frequency domain outputs as outputs. The discrete Fourier transform has an input discrete Fourier computation stage 402 comprised of three eight point preweaves 404, three intermediate discrete Fourier computation stages, 410, 412 and 414, respectively comprised of eight three point preweaves 416, a multiply stage and eight three point postweaves 418 and an output discrete Fourier computation stage 419 comprised of three eight point postweaves 420.

SUMMARY OF THE INVENTION

The present invention is a digital channelizer and a method which divides an input bandwidth, such as the wideband signal which is received by a satellite, into at least some of N possible channels.

A digital channelizer in accordance with the invention has an efficient architecture, organization and movement of data from the window presum through the discrete Fourier transform device. The decimation rate M is not limited to being equal to N. The use of distributed arithmetic reduces hardware required for the window presum operation compared to the prior art of FIG. 5. An efficient layout of window presum computations permits efficient cyclic shifts, which map directly into the discrete Fourier transforms. The output discrete Fourier computation stage may be simplified when not all channels are required as outputs.

The digital channelizer includes a window presum computer having a modular processing architecture which transfers words stored within memory elements, which in the preferred form of the invention is a connected array of registers, in a systematic and periodic pattern to complete window presum computations during a single clock cycle. Minimizing the number of operations which must be performed to complete the window presum operation reduces power consumption and permits the system to operate at higher throughputs. Furthermore, a modular implementation of a window presum computer as parallel window presum circuits simplifies the memory structure of the registers in the window presum by permitting the same register array within an integrated circuit to be used for each of the parallel processing paths.

The window presum operation is performed in parallel in modular window presum circuits which efficiently map into the cyclic shift and discrete Fourier transform device which are also implemented as a modular architecture. The number of parallel paths, which is equal to the number of window presum circuits, may be determined by the value of the GCD(N,M). When the number of window presum circuits is determined by the value of GCD(N,M), hardware use is reduced in view of the processings from the window presum computations, cyclic shifting and DFT being efficiently mapped into a minimum amount of hardware. The processing speed of each of the integrated circuits within the parallel processing paths is at a lower clock rate. Parallel processing within the window presum computer, cyclic shift and discrete Fourier transform apparatus permits slower, but more power efficient integrated circuit technologies, such as CMOS, to be used to perform the required operations. Slower parallel operations lessen the generation of heat caused by high clock rates.

The window presum computer processes a block of words produced by analog to digital conversion which have a data length L. The data sequence is windowed by multiplying each word by the preassigned window presum function coefficient which is chosen to provide the filter requirement as, for example, illustrated in FIGS. 4A and 4B. Each of R individual subparts of the window, which are N words long, are processed word by word to provide products of the word value times the preassigned window presum function coefficient. While the invention is not limited thereto, the preferred form of summing the individual products of the words times the window presum function coefficients is with distributed arithmetic which calculates the summation of the products of words and their preassigned window presum coefficients within a single clock cycle.

A window presum in accordance with the invention is responsive to parallel data streams of words which are used to produce N outputs for every M input words, which are subsequently processed into N channels such that each channel data rate has been decimated by a factor of M from the original. The N outputs each are a function of a window function and a function of a plurality of inputs to the window presum.

A digital channelizer which divides an input bandwidth into at least some of N channels in accordance with the invention includes a window presum, responsive to input data, which outputs real or complex data; a cyclic shift, coupled to the real or complex data outputted from the window presum, which outputs real or complex data which is cyclic shifted relative to data outputted from the window presum; and an N point discrete Fourier transform apparatus, coupled to the shifted real or complex data, which in response to a command performs a discrete Fourier transform on inputted cyclic shifted real or inputted cyclic shifted complex data to produce the channels, the discrete Fourier transform apparatus performing a transformation of the inputted cyclic shifted real data when the command specifies processing of the inputted cyclic shifted real data and performing a transformation of the inputted cyclic shifted complex data when the command specifies processing of the inputted cyclic shifted complex data and wherein the N point discrete Fourier transform includes an input discrete Fourier computation stage having two N/2 point discrete Fourier transforms having inputs coupled to outputs of the cyclic shift and a plurality of outputs and an output discrete Fourier computation stage having N/2 two point discrete Fourier transforms having a plurality of inputs coupled to outputs of different ones of the two N/2 point discrete Fourier transforms of the input discrete Fourier computation stage and a plurality of outputs which are different ones of the channels.

A system in accordance with the invention includes a plurality of inputs which provide real data or complex data; an N point discrete Fourier transform apparatus, coupled to the plurality of inputs, which provides a multiple point discrete Fourier transform of the plurality of inputs, and is responsive to a command to transform the real or complex data to output transformed real data when real data are provided to the inputs and the command specifies transforming real data and to output transformed complex data which have been processed when complex data are provided to the inputs and the command specifies transforming complex data; and wherein the discrete Fourier transform apparatus includes an input discrete Fourier computation stage having two N/2 point discrete Fourier transforms having inputs and a plurality of outputs and an output discrete Fourier computation stage having N/2 two point discrete Fourier transforms having a plurality of inputs coupled to outputs of different ones of the two N/2 point discrete Fourier transforms of the input discrete Fourier computation stage and a plurality of outputs which are different ones of the channels.

A process for dividing an input bandwidth into at least some of N channels in accordance with the invention includes providing a window presum having N outputs of real or N/2 outputs of complex data containing a real component and an imaginary component with each output being a function of a window presum function; cyclic shifting the outputs produced by the window presum to produce shifted real or complex data; and providing an N point discrete Fourier transform including an input discrete Fourier computation stage having two N/2 point discrete Fourier transforms and an output discrete Fourier computation stage having N/2 two point discrete Fourier transforms which perform a discrete Fourier transform on the cyclic shifted, real or complex data in response to a command to produce an output transformation of real or an output of complex data comprising a transform of real data when the command specifies transforming real data and the cyclic shifted data are real data and comprising a transform of complex data when the command specifies transforming of complex data and the cyclic shifted data are complex data.

A process for performing a discrete Fourier transform of real or complex data in accordance with the invention includes providing an N point discrete Fourier transform including an input discrete Fourier computation stage having two N/2 point discrete Fourier transforms and an output discrete Fourier computation stage having N/2 two point discrete Fourier transforms which transform a plurality of input signals containing either the real data or the complex data; and performing a discrete Fourier transform with the N point discrete Fourier transform, in response to a command, on the real or complex data to produce a transform of the real data when the command specifies transformation of real data and the inputted data is real data and to produce a transform of complex data when the command specifies transformation of complex data and the inputted data is complex data.

It should be understood that the invention is not limited to its elements as summarized above.

BRIEF DESCRIPTION OF THE DRAWINGS

FIG. 6 illustrates a prior art hardware implementation for providing a finite impulse response filter function.

FIG. 7 illustrates a prior art hardware implementation for calculating a window presum of individual corresponding data words in accordance with the window presum function of FIG. 4A.

FIG. 19 is a table illustrating cyclic shifts of the cyclic shift of FIG. 18 required for the outputs of the window presum circuits of FIGS. 14–16 of the present invention.

FIG. 23 is a block diagram of a two-point discrete Fourier transform/recombine for processing real data.

FIG. 24 is a block diagram of a two-point discrete Fourier transform/recombine for recombining complex data.

FIG. 25 is a block diagram of mulitplication by –j (a twiddle factor) of an output of one of the three point discrete Fourier transforms of FIG. 22.

FIG. 26 is a block diagram of an embodiment of a two point discrete Fourier transform/recombine which performs the operations of FIGS. 23–25.

Like reference numerals identify like parts throughout the drawings.

DESCRIPTION OF THE PREFERRED EMBODIMENTS

Figure 1:
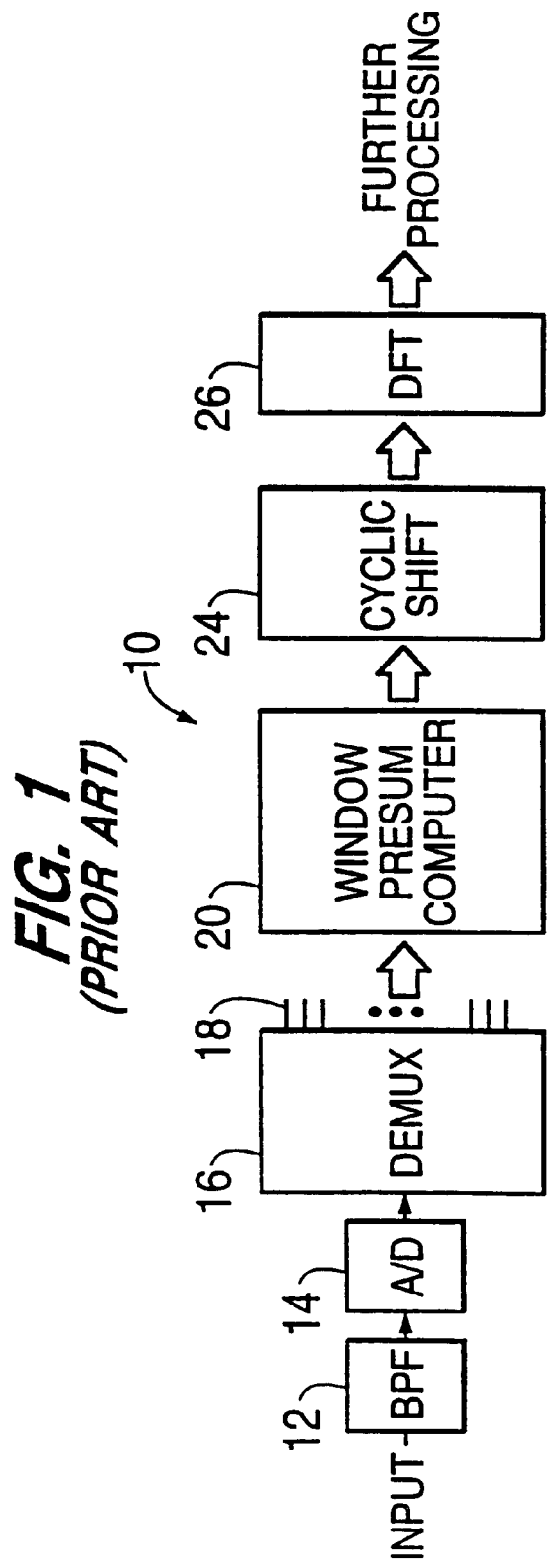
FIG. 1 illustrates a block diagram of a prior art digital channelizer.
Figure 2:
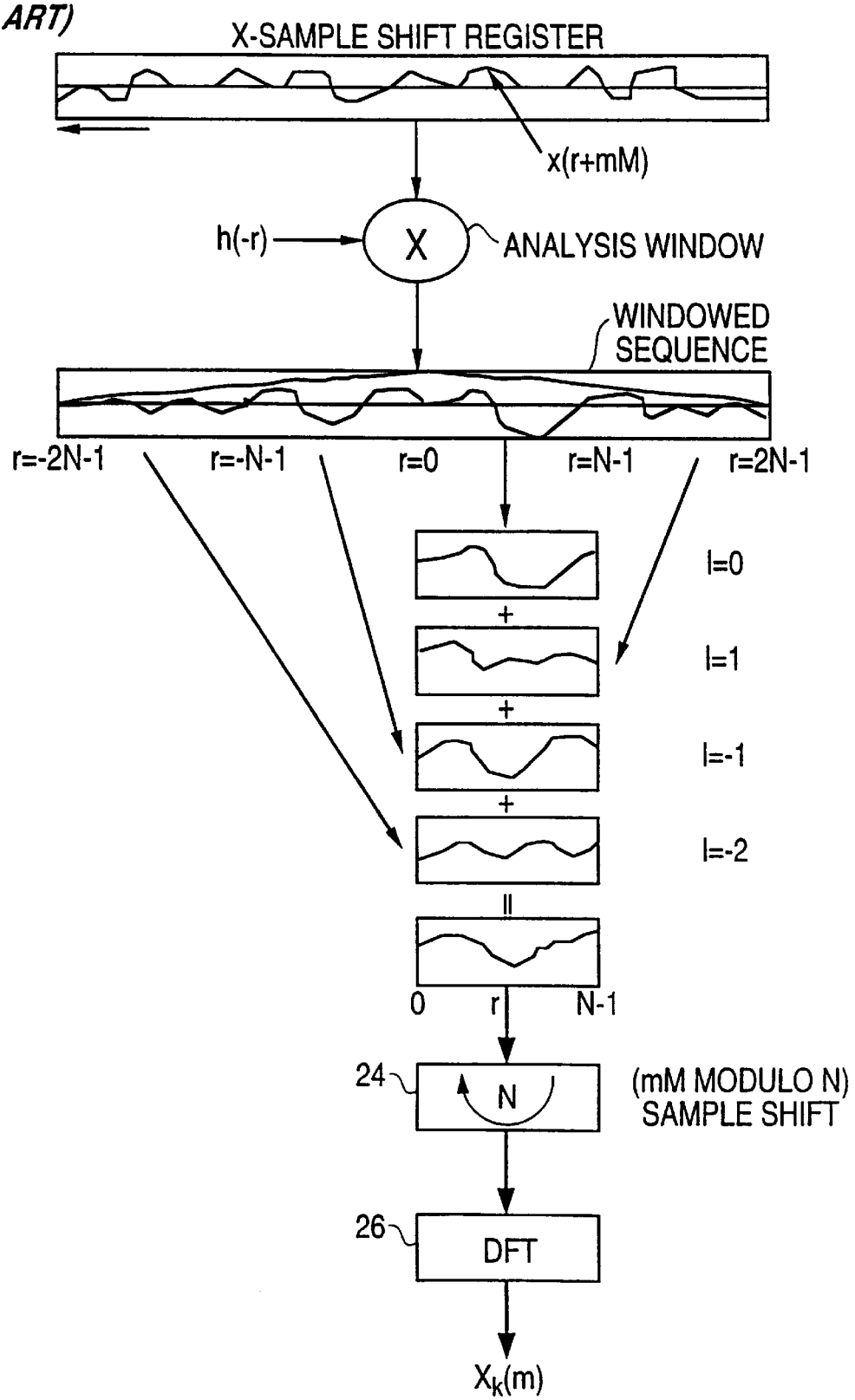
FIG. 2 illustrates a processing diagram representative of the processing of the prior art of FIG. 1.
Figure 4A:
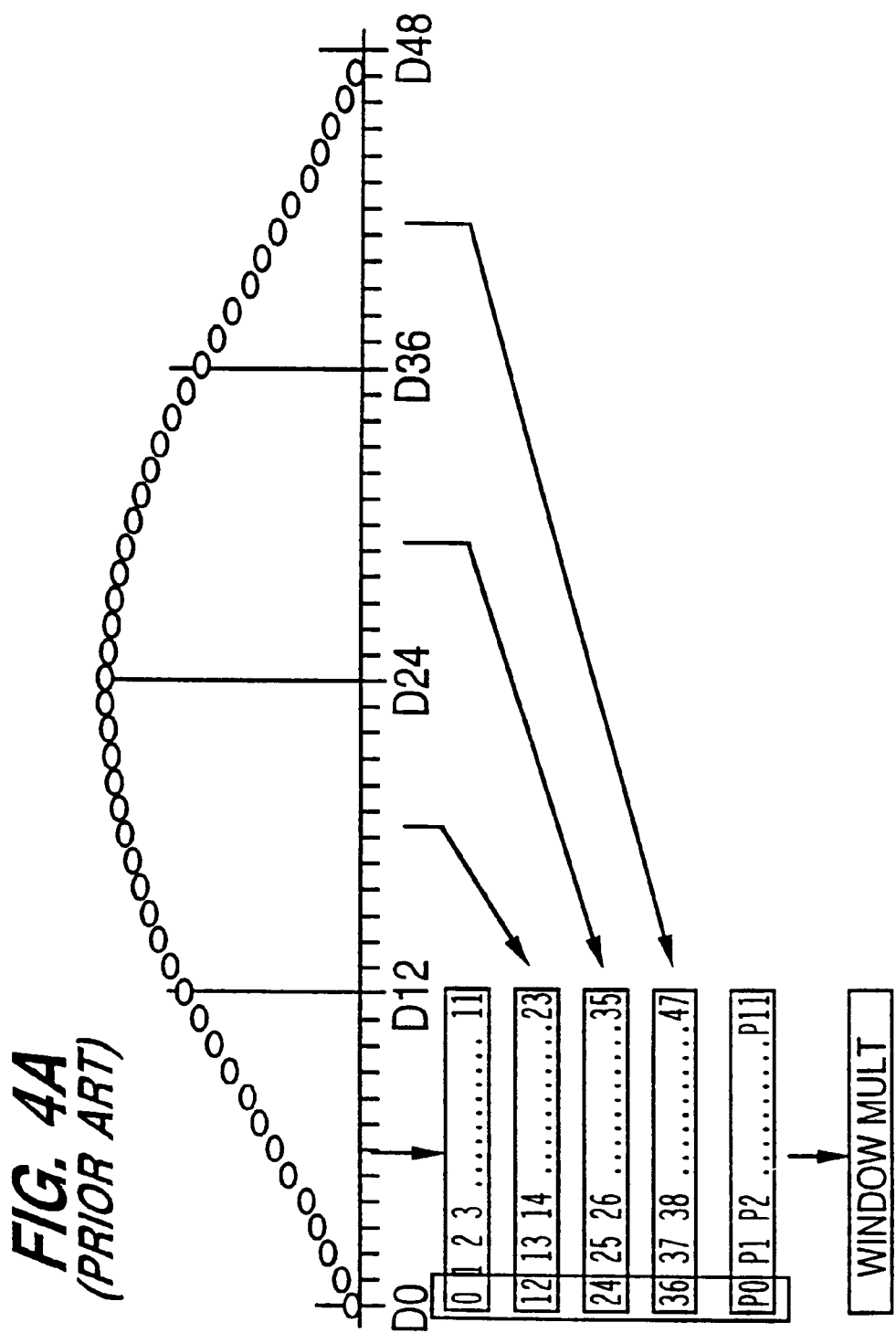
FIGS. 4A and 4B illustrate a prior art window presum function containing respectively real and complex data words.
Figure 4B:
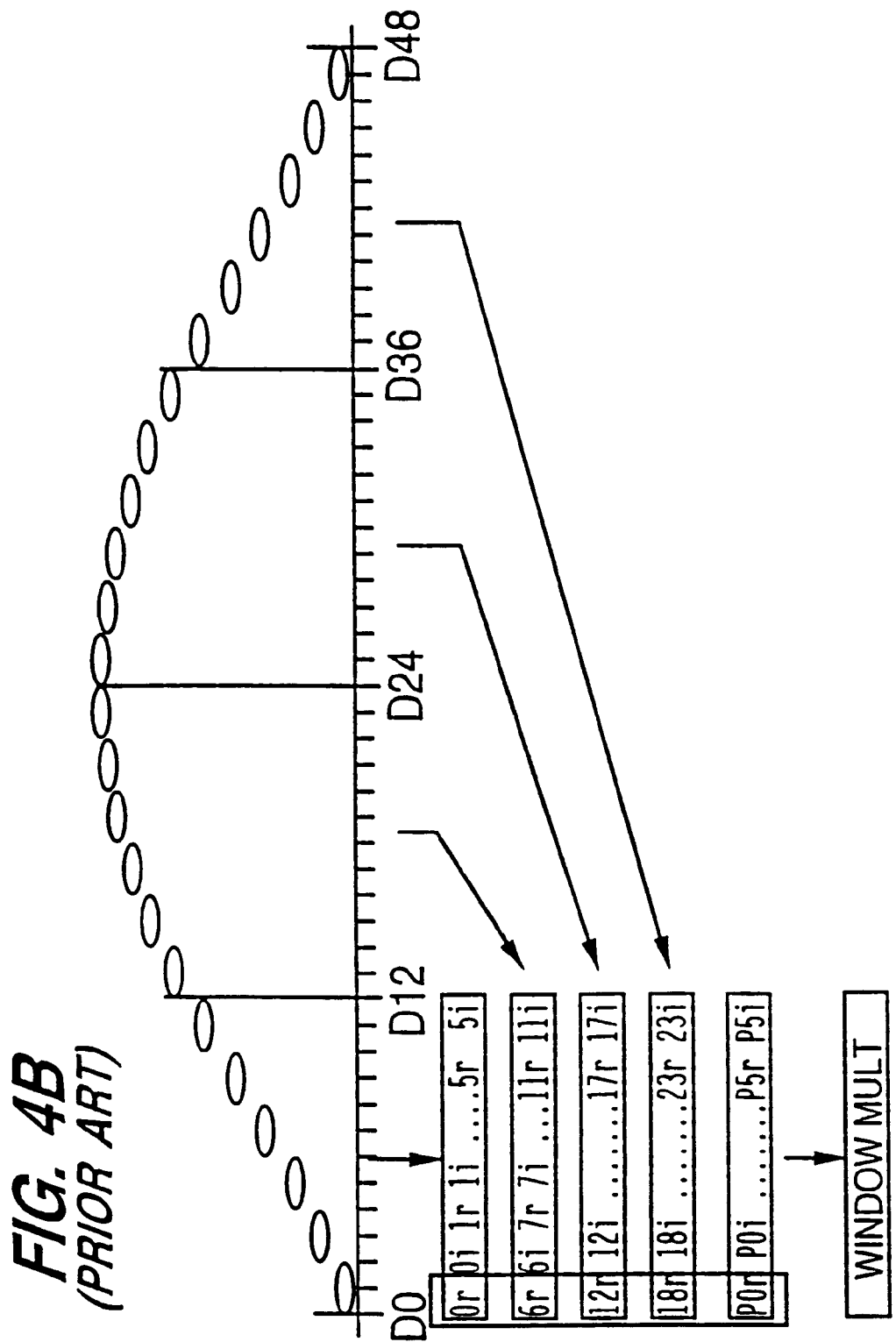
Figure 12:
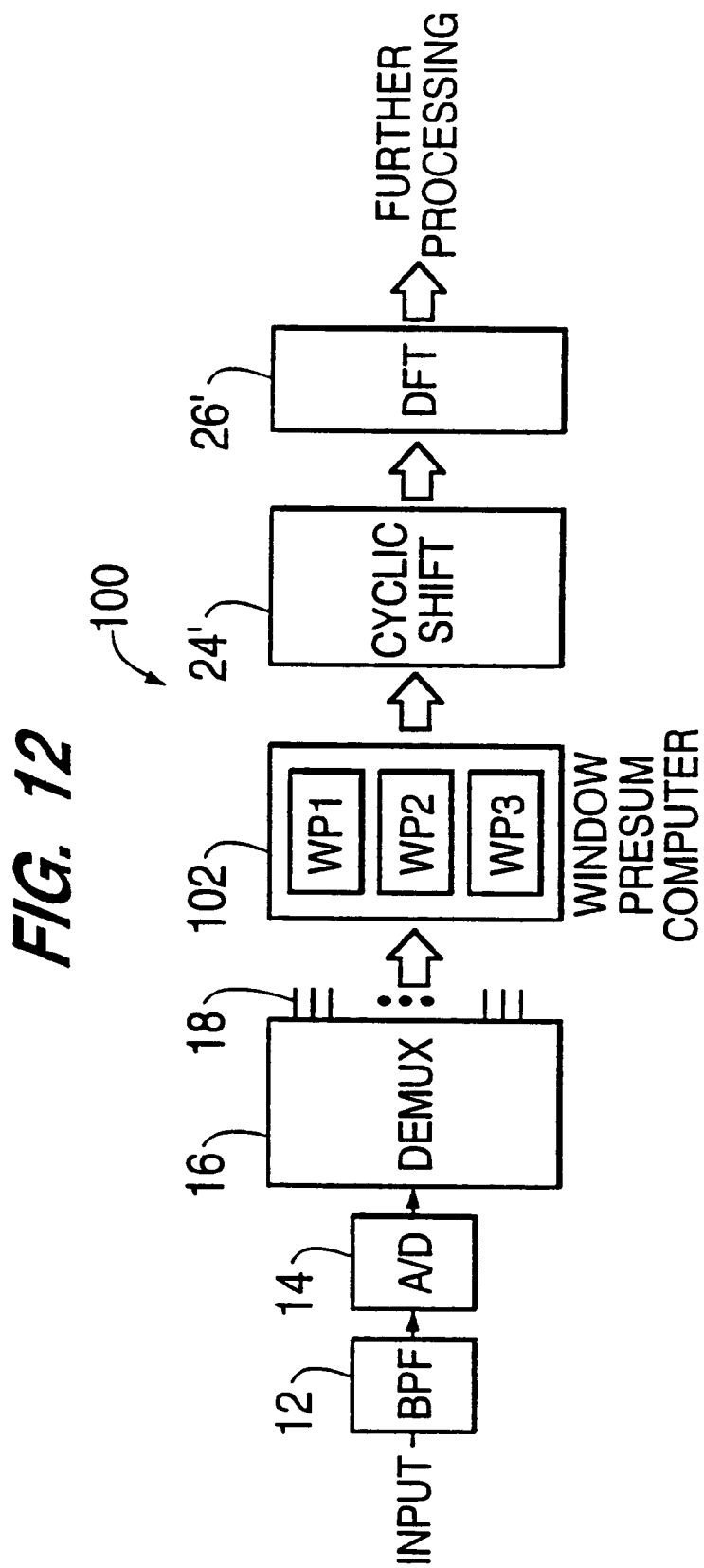
FIG. 12 illustrates a block diagram of the present invention.

FIG. 12 illustrates a block diagram of a digital channelizer 100 in accordance with the present invention. Differences between the embodiment 100 of FIG. 4 and the prior art of FIG. 1 are that the window presum computer 102 is implemented as a plurality of parallel window presum circuits WP1, WP2 and WP3, which may vary in number in accordance with window presum processing requirements and the cyclic shift 24' and discrete Fourier transform apparatus 26' have been modified to a similar parallel architecture to provide high speed calculation with lower power consumption and simplified hardware requirements. The window presum circuits WP1, WP2 and WP3 each perform processing in parallel to implement the functions of the window presum computer 20. The number of window presum circuits I is preferably equal to GCD(N,M), which for the example of M=15 and N=24 makes I=3, which results in an efficient deployment of hardware operating at a lower clock speed in the individual parallel processing paths of data in the window presum circuits WP1, WP2 and WP3, cyclic shift 24' and discrete Fourier transform apparatus 26' as described below which is important in satellite applications.

The window presum computer 102 implemented as a plurality of window presum circuits operating in parallel permits a lower clock rate in each window presum circuit. As a result, slower integrated circuit technologies may be used to implement all of the processing in the I parallel data processing paths extending from the window presum circuits WP1, WP2 and WP3 through the discrete Fourier transform apparatus 26' as described below which consume less power, such as CMOS circuits.

Parallel processing achieves a high throughput data rate of window presum processing of words required to perform the complete window presum computer function in a wide band satellite application. In view of a preferred embodiment of the present invention being in a satellite, it is highly desirable to lessen heat generating energy consumption resultant from a high clock rate in the window presum computer 102, the cyclic shift 24' and discrete Fourier transform apparatus 26' which is accomplished by implementation of the window presum computer, cyclic shift and discrete Fourier transform apparatus in a parallel architecture in a low-power consuming technology (such as CMOS).

Figure 13:
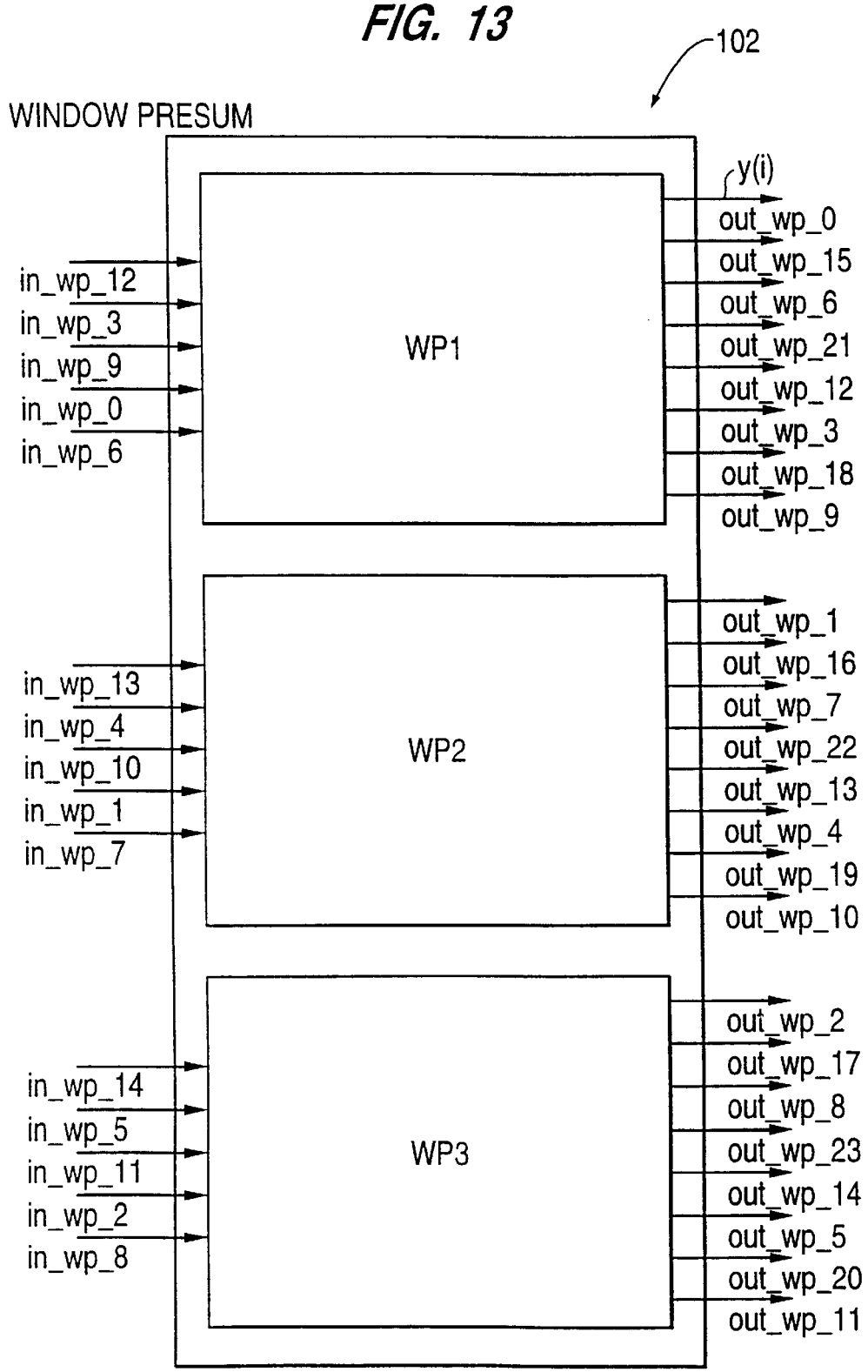
FIG. 13 illustrates a block diagram of a window presum computer in accordance with the present invention.
Figure 20:
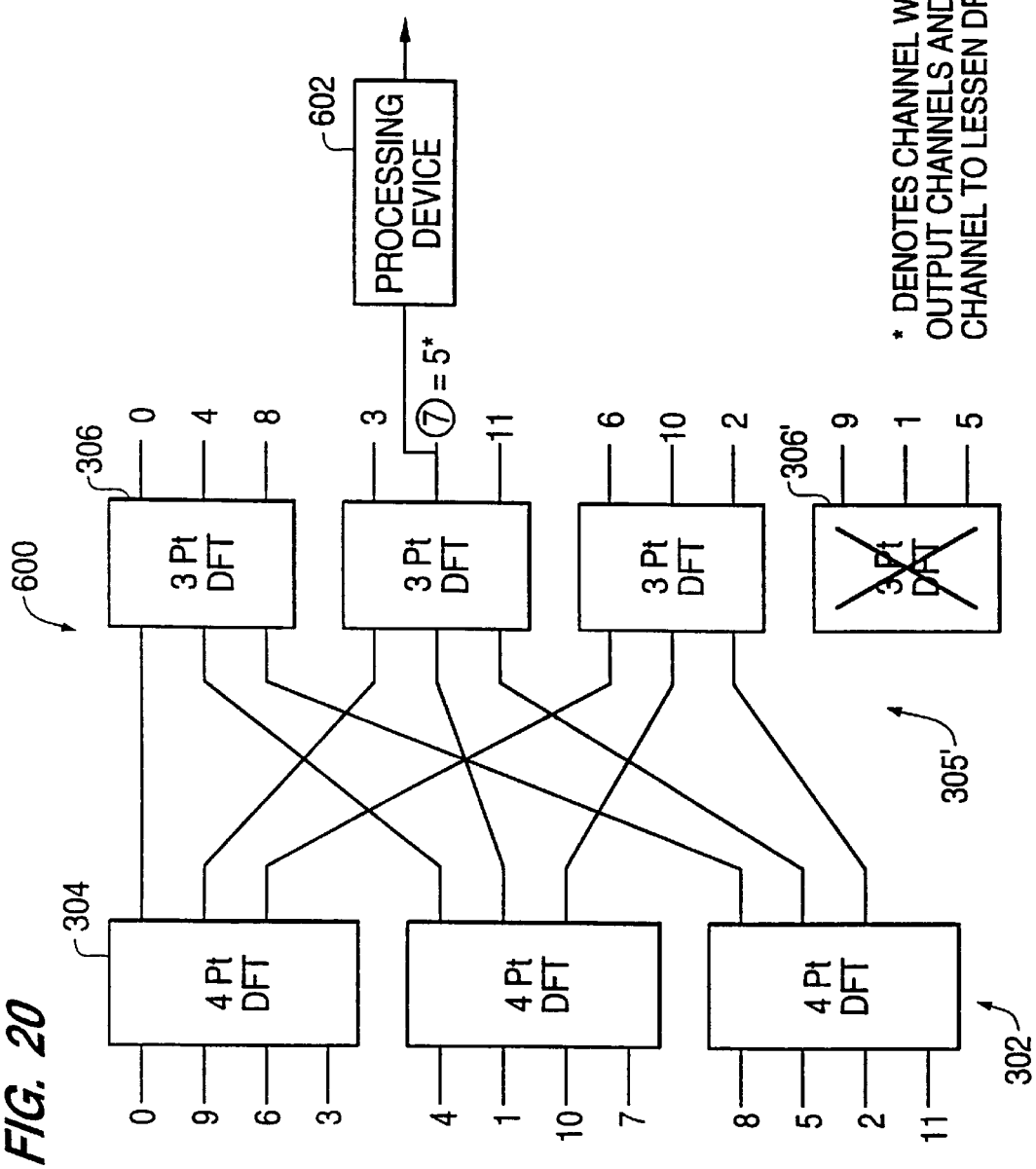
FIG. 20 is a first embodiment of a pruned discrete Fourier transform apparatus in accordance with the present invention.
Figure 21:
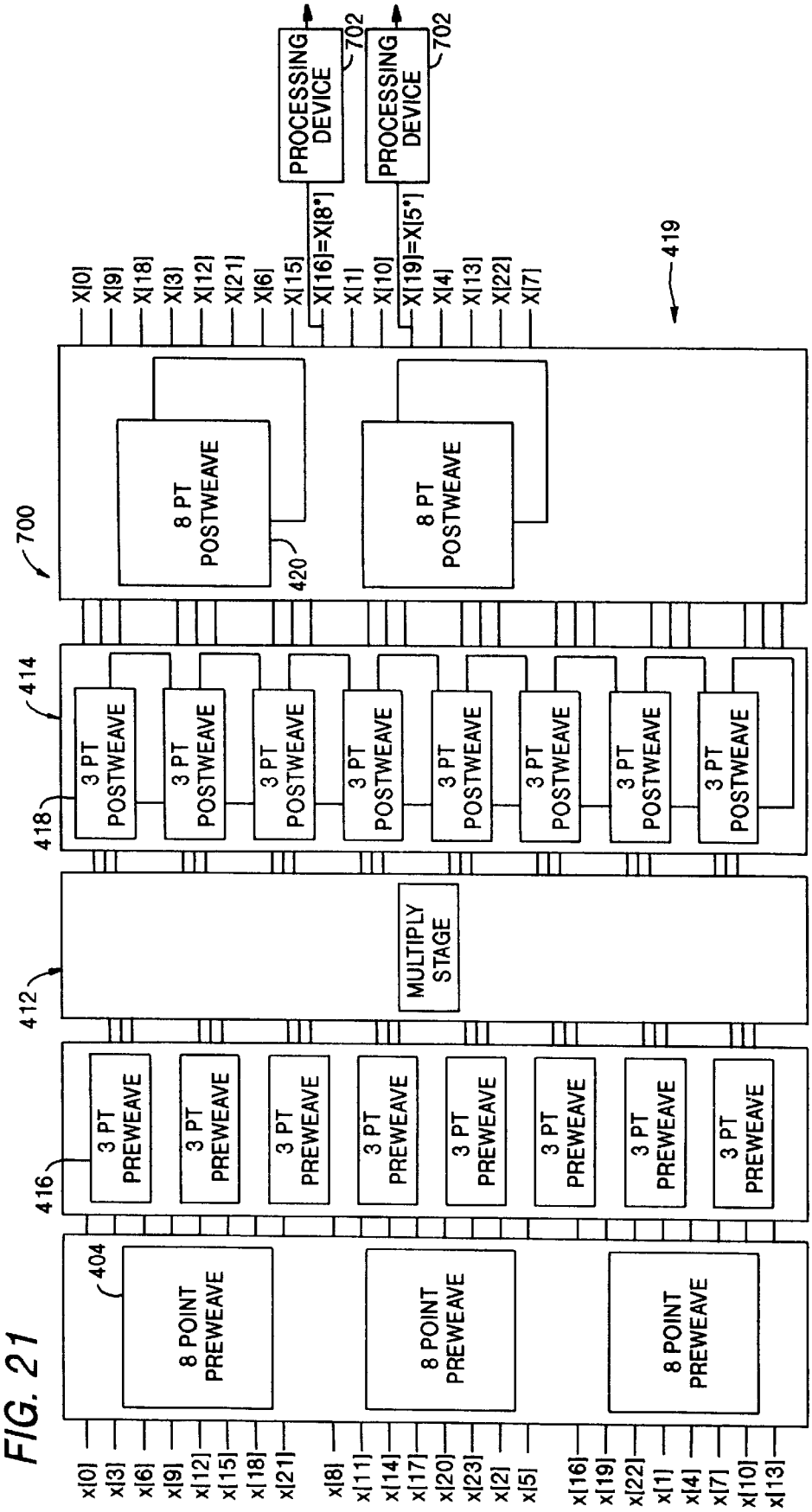
FIG. 21 is a second embodiment of a pruned discrete Fourier transform apparatus in accordance with the present invention.
Figure 22:
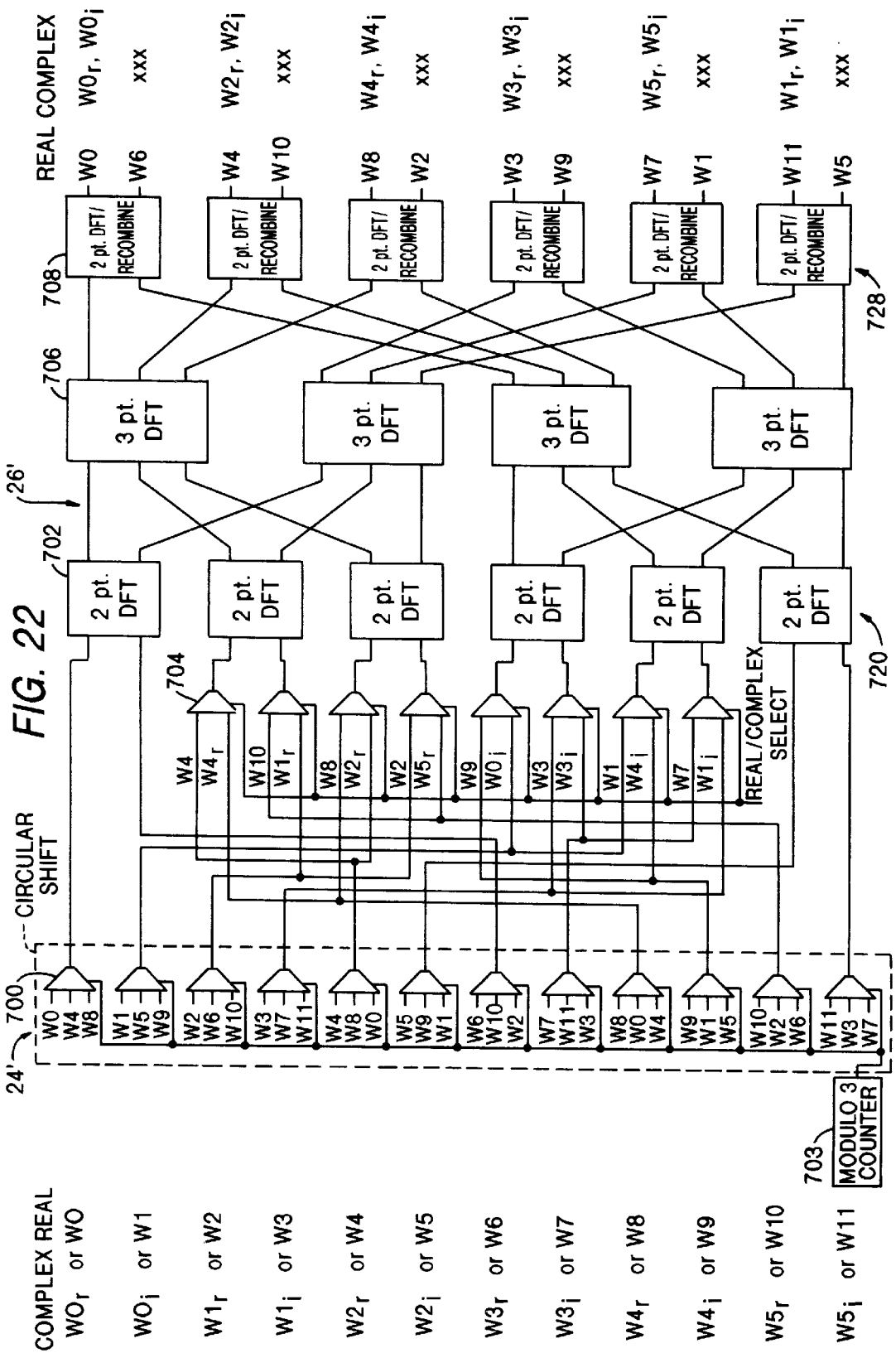
FIG. 22 is a block diagram of an embodiment of a discrete Fourier transform apparatus in accordance with the present invention which calculates the transformation of real or complex data inputs with a processing architecture which is configured to transform real or complex data in response to command.

FIG. 13 illustrates a block diagram of the three window presum circuits WP1, WP2 and WP3 which comprise the window presum computer 102. The use of I parallel processing paths within the window presum computer 102, the cyclic shift 24' of FIG. 12 as described below in conjunction with FIGS. 18 and 19 and the I parallel processing paths within the discrete Fourier transform apparatus 26' as described below in conjunction with FIGS. 20–22 is a highly efficient hardware implementation. The number D of parallel paths of input data from the demultiplexer 16 (also equal to M the decimation rate in this instance) is 15 with input data words "in_wp_0" thru "in_wp_14" each comprised of multiple bits being shifted into the window presum circuits 102 during one clock cycle. The decimation rate M is not necessarily equal to a number of branches in the demultiplexer 16. Each of the window presum circuits 102 performs window presumming, described below in detail in conjunction with FIGS. 14–17, to output for each clock cycle N output words "out_wp_0" thru "out_wp_23" which represent the N channels which are produced by the digital channelizer or with a reduced number of channels produced by pruning the DFT structure as described below in conjunction with FIG. 21 which is used within a channelizer. Each of the output words y(i), which are inputs to the cyclic shift 24', is a function of the window presum function calculated by the sum of products of stored coefficients for each of the corresponding R input words with the corresponding input words respectively from the parallel inputs of one of the I groups of input words and summing those R words together.

Figure 14:
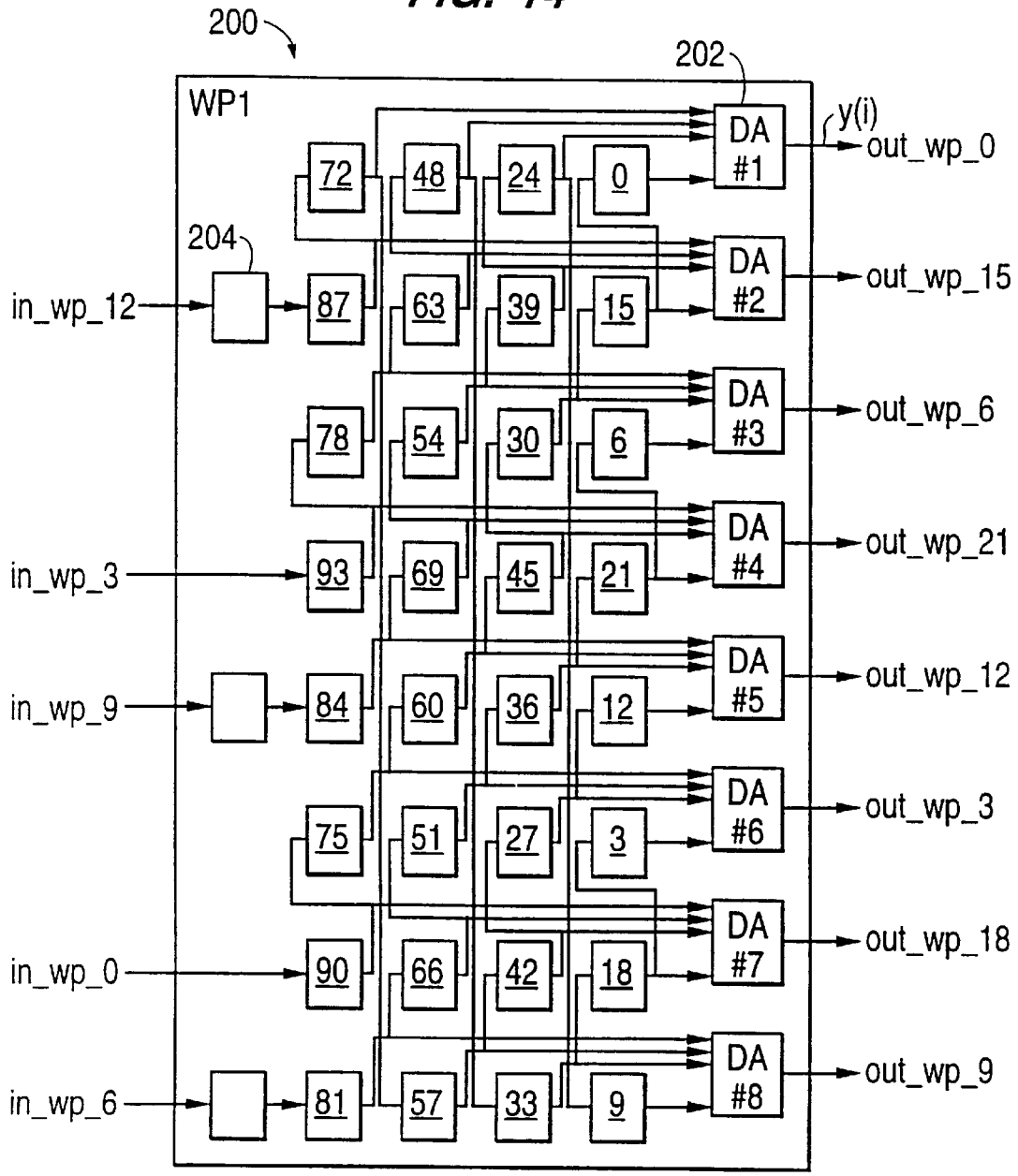
FIGS. 14–16 illustrate an embodiment of the individual window presum circuits of the window presum computer of FIG. 13.
Figure 15:
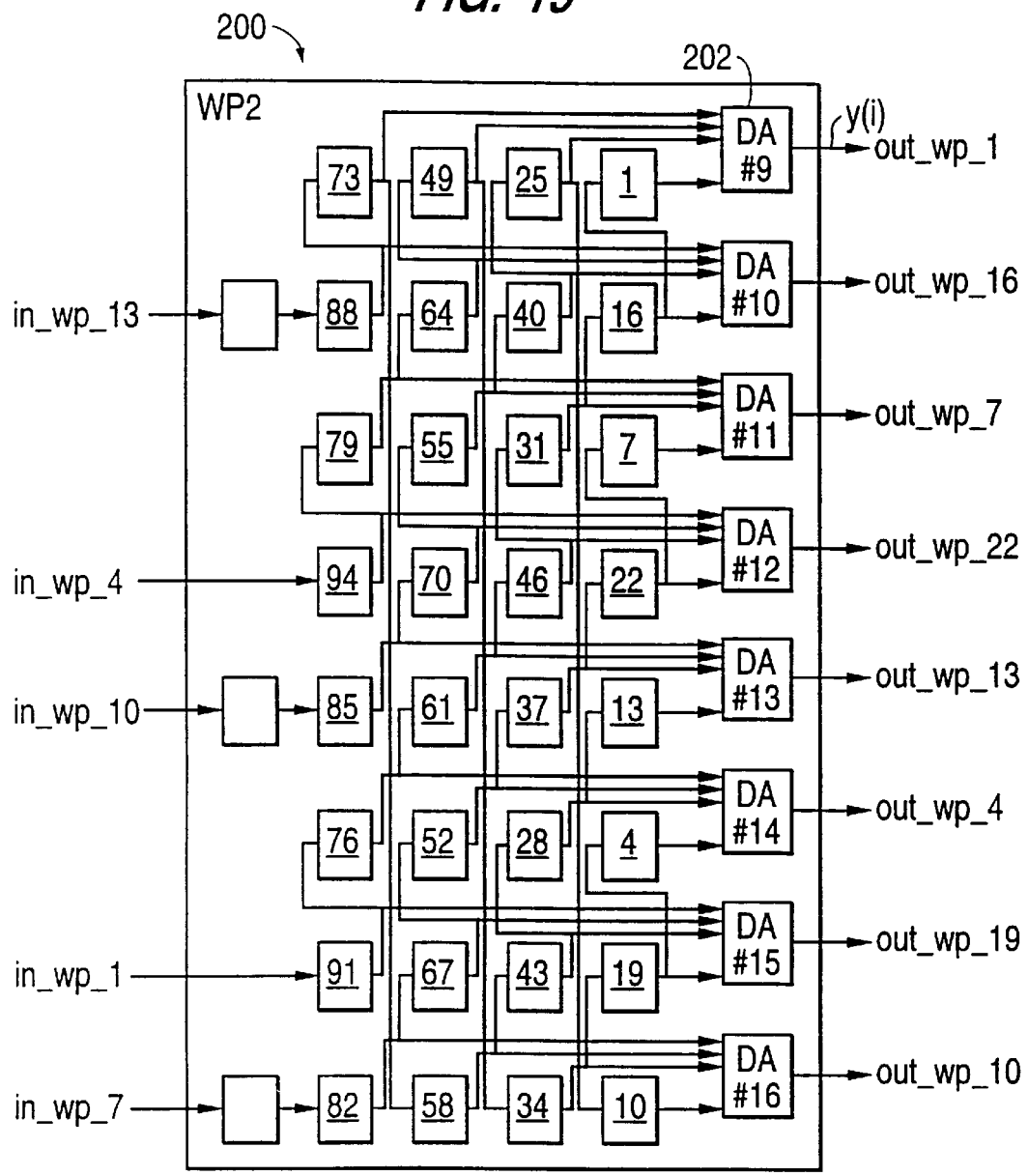
Figure 16:
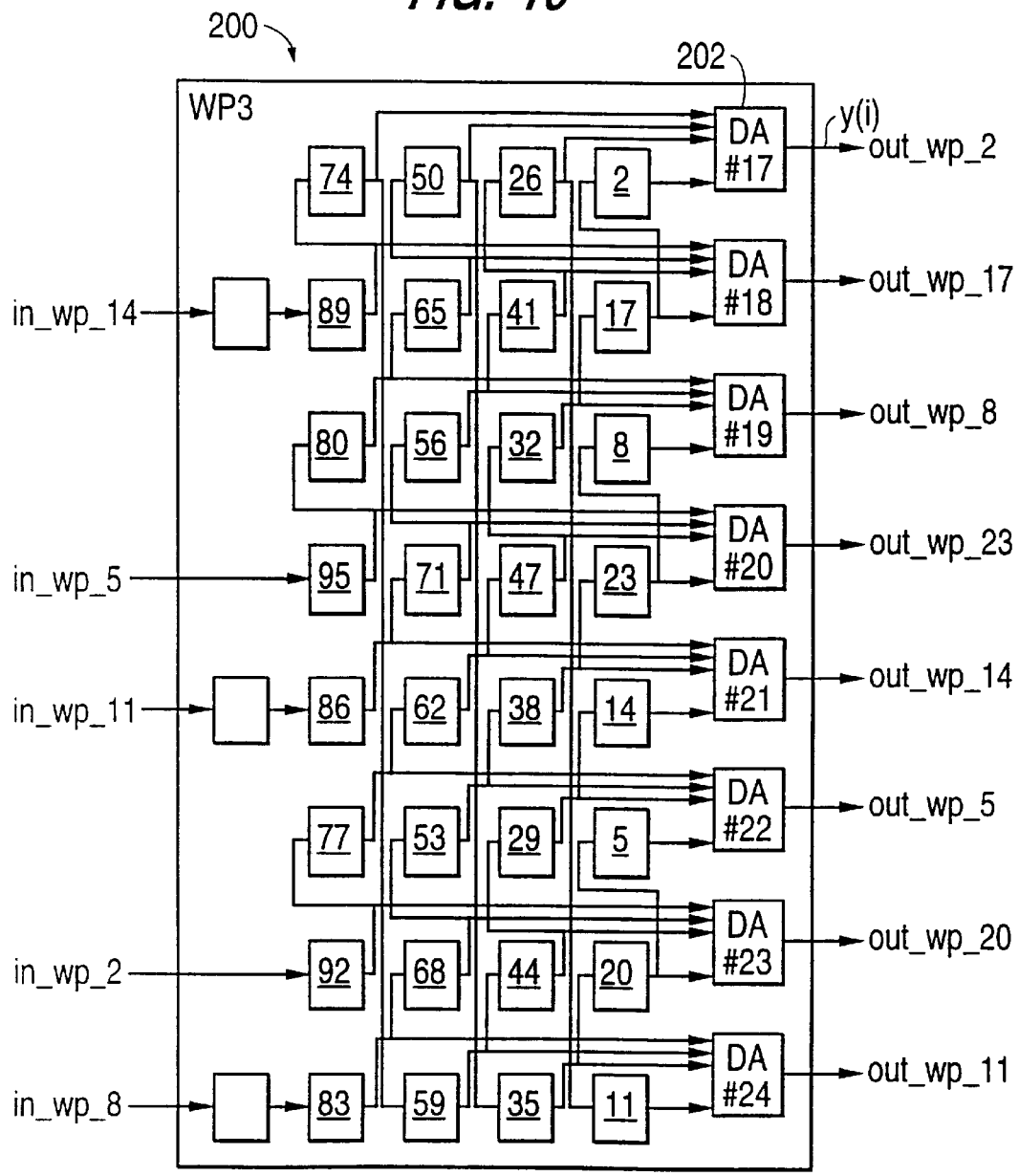

FIGS. 14–16 respectively illustrate an implementation of each of the individual window presum circuits WP1, WP2 and WP3 of FIG. 13. The window presum circuits 200 are identical, permitting their use in a modular architecture. Each window presum circuit has a number L' of registers equal to the number of data points in each of the I groups wherein:

$$L' = \frac{L}{GCD(N, M)}$$

In the window presum circuits 200 in FIGS. 14–16, input data words are shifted through registers which are connected in a group of R registers to individual distributed arithmetic functions 202 (DA#1–DA#24) which process the input data words to compute the individual products of each data word and its stored window presum function coefficient followed by a summation of the products which is outputted as the data words y(i). The calculation of the summation y(i) does not require the use of distributed arithmetic. However, preferably the calculation of the summation y(i) is performed with distributed arithmetic. A preferred implementation of the calculation of y(i) with distributed arithmetic is described below in conjunction with FIG. 17 which requires only a single clock cycle to complete the calculation of each value of y(i). The parallel processing of each of the window presum circuits lowers the clock rate permitting energy efficient integrated circuit implementations such as CMOS to be used.

The individual numbers appearing inside of the rectangular boxes, representing registers, identify particular stored data words in a data sequence in a window which is L words long, e.g. 96. Each of the words may have any number of bits. Additionally, buffering registers 204 are provided where time shifting for a clock cycle is necessary. The input words are identified by the legend "in_wp_" followed by a number and output words, which are outputted for each clock cycle, are identified by the legend "out_wp_" followed by a number.

Each of the outputs y(i) of the window presum circuits of FIGS. 14–16 is a function of a window presum function and data words from a plurality of the parallel data streams which are inputs "in-wp" thereto that are the outputs from the demultiplexer 18. The calculation of each output y(i) is described in further detail below in conjunction with FIG. 17. For example, with reference to FIG. 14, input word "in_wp_12" is coupled to register 87 which is directly coupled to a distributed arithmetic calculator DA#2 and is an input to register 72 which is directly coupled to DA#1. Furthermore, input word "in_wp_3" is directly coupled to register 93 which is coupled to register 78 which is coupled to register 63 which is coupled to register 48 which is directly coupled to DA#1. Therefore, the word output y(i) "out_wp_0" is a function of "in_wp_12" and "in_wp_3", as well as being a function of input words "in_wp_9" and "in_wp_0". Furthermore, the number of R inputs respectively from R different registers coupled to each distributed arithmetic function or circuit 202 is equal to the number of subparts of the window of L words processed by the window presum function which each contain N words. Similarly, the outputs of the other distributed arithmetic functions or circuits 202 are a function of a plurality of input words respectively from R different registers.

As may be seen, corresponding words stored in each of the R subparts are inputs to the distributed arithmetic function 202, e.g. DA#1 has R inputs. Each distributed arithmetic function 202 produces a sum y(i) of four weighted products. The different sums y(i) are also identified as output words "out_wp_0–out_wp_23". Each output y(i) mathematically represents the sum value of each of the input words multiplied by that word's preassigned individual window presum function coefficient of the filter, such as the filter functions illustrated in FIGS. 4A and 4B.

Certain relationships define a preferred window presum computer 102 implementation in accordance with the present invention. The window presum has N outputs which are equal in number to the number N of possible output channels produced by the digital channelizer and the number of points in the discrete Fourier transform apparatus 26'. The window presum computer 102 as described has a total of D inputs which is equal to M, the decimation rate, and represents the number of data words which are inputted to the window presum computer during each clock cycle. However, the invention is not limited to embodiments in which D equals M.

It should be understood that the clock circuit utilized in the register implementation of FIGS. 14–16 has been omitted for purposes of simplicity and operates at a slower speed than the serial input data rate because of the parallel operation of the window presum circuits WP1, WP2 and WP3.

The window presum computer 102 comprises I window presum circuits with I equal to GCD(N,M). Each window presum circuit is responsive to a different one of the groups of data words. As may be seen, the data words, which are inputs to FIG. 14, are data words 0, 3, 6, 9 and 12; the data words which are inputs to FIG. 15 are data words 1, 4, 7, 10 and 13; the data words which are inputs to FIG. 16 are data words 2, 5, 8, 11 and 14. The data words y(i) which are outputs from FIG. 14 are data words 0, 3, 6, 9, 12, 15, 18 and 21; the data words y(i) which are outputs from FIG. 15 are data words 1, 4, 7, 101 13, 16, 19 and 22; and the data words y(i) which are outputs from FIG. 16 are data words 2, 5, 8, 11, 14, 17, 20 and 23. Each window presum circuit WP1, WP2 and WP3 is responsive to a different one of the groups of the aforementioned data input words and produces N' outputs with each of the N' outputs being a function of the window presum function, as illustrated, for example, in the prior art of FIGS. 4A and 4B, and a plurality of the data input words with N' not being equal to M and the ratio of N/N'=I.

The window presum circuits 200 are useful in a modular architecture. Consumption of power is reduced. Undesirable heating of integrated circuits, which is disadvantageous for applications such as satellites, is lessened which is a primary field of application of the present invention. Data processing in each of the window presum circuits is identical, systematic and in a periodic pattern which allows operations performed by each of the individual window presum circuits WP1, WP2 and WP3, which are preferably integrated circuits, to perform identical processing with each clock cycle. Identical standard window presum circuits implemented in a modular parallel architecture allow the clock rate of the window presum computer 102 to be lowered which lowers power consumption. The number of operations performed to complete the window presum operation is reduced. Interconnect and logic complexity required to perform presum operations is reduced.

Figure 17:
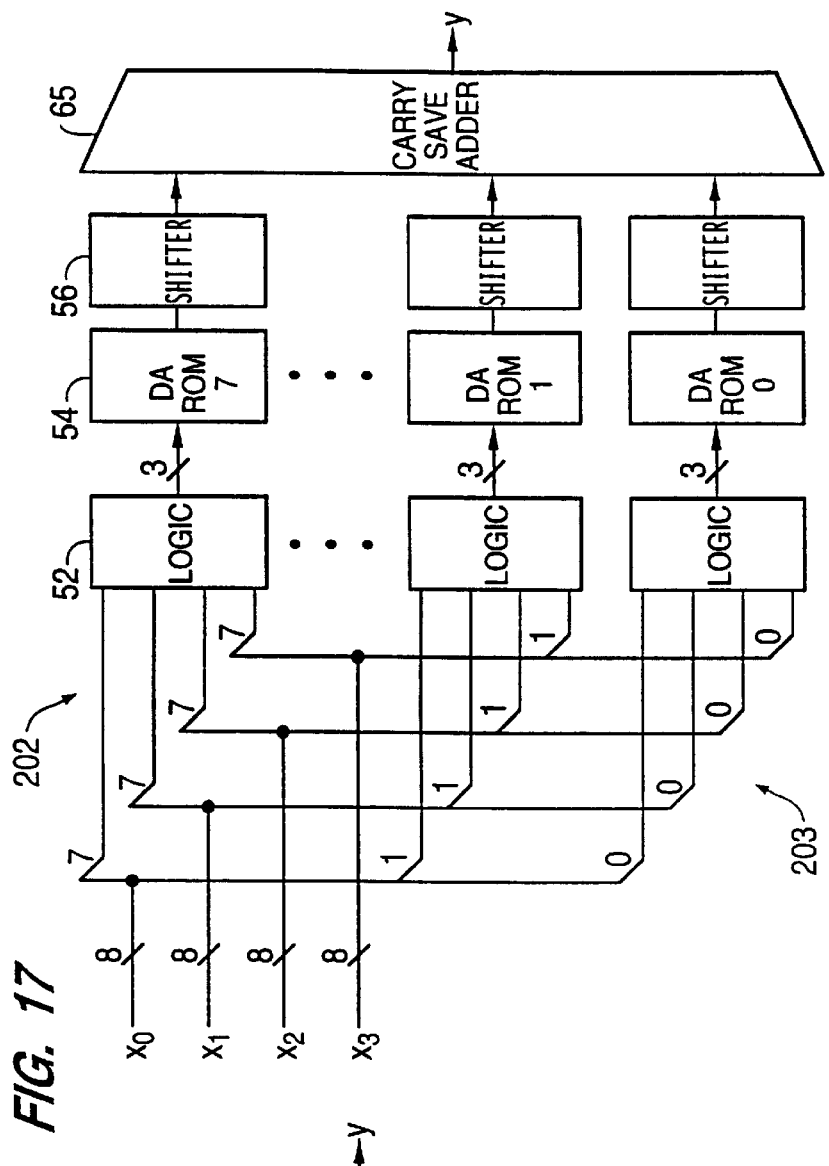
FIG. 17 illustrates a block diagram of a preferred form of distributed arithmetic used in the window presum computer of FIGS. 12–16 with the practice of the present invention.
Figure 5:
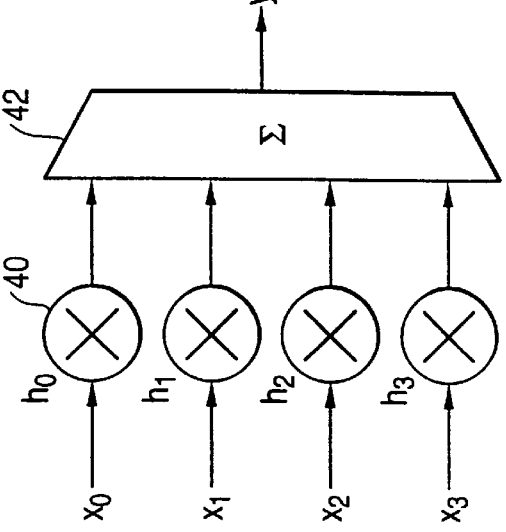
FIG. 5 illustrates a prior art hardware implementation for calculating a window presum for individual corresponding words in accordance with the window presum function of FIG. 4A.
Figure 8:
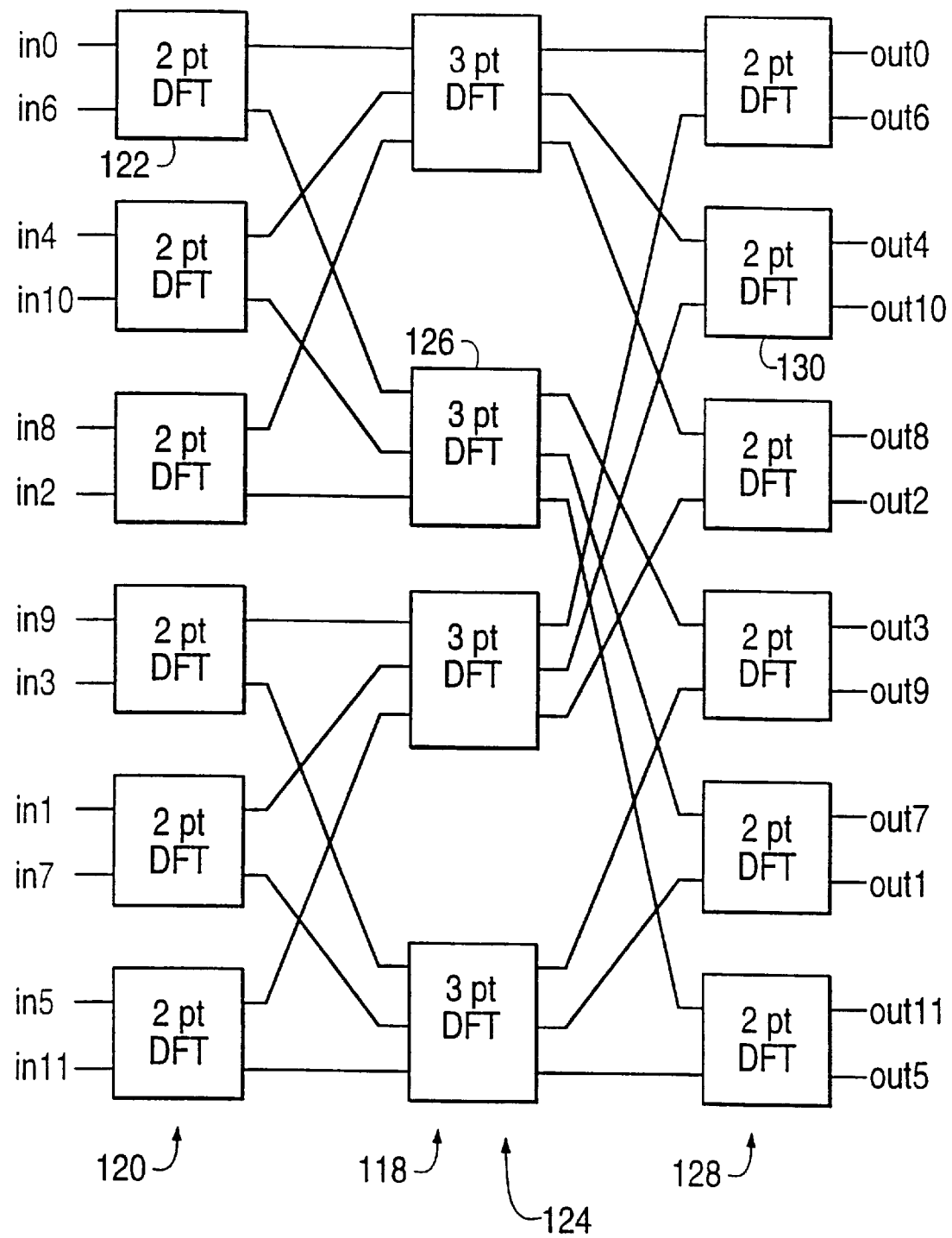
FIG. 8 illustrates a first type of prior art discrete Fourier transform apparatus.
Figure 9:
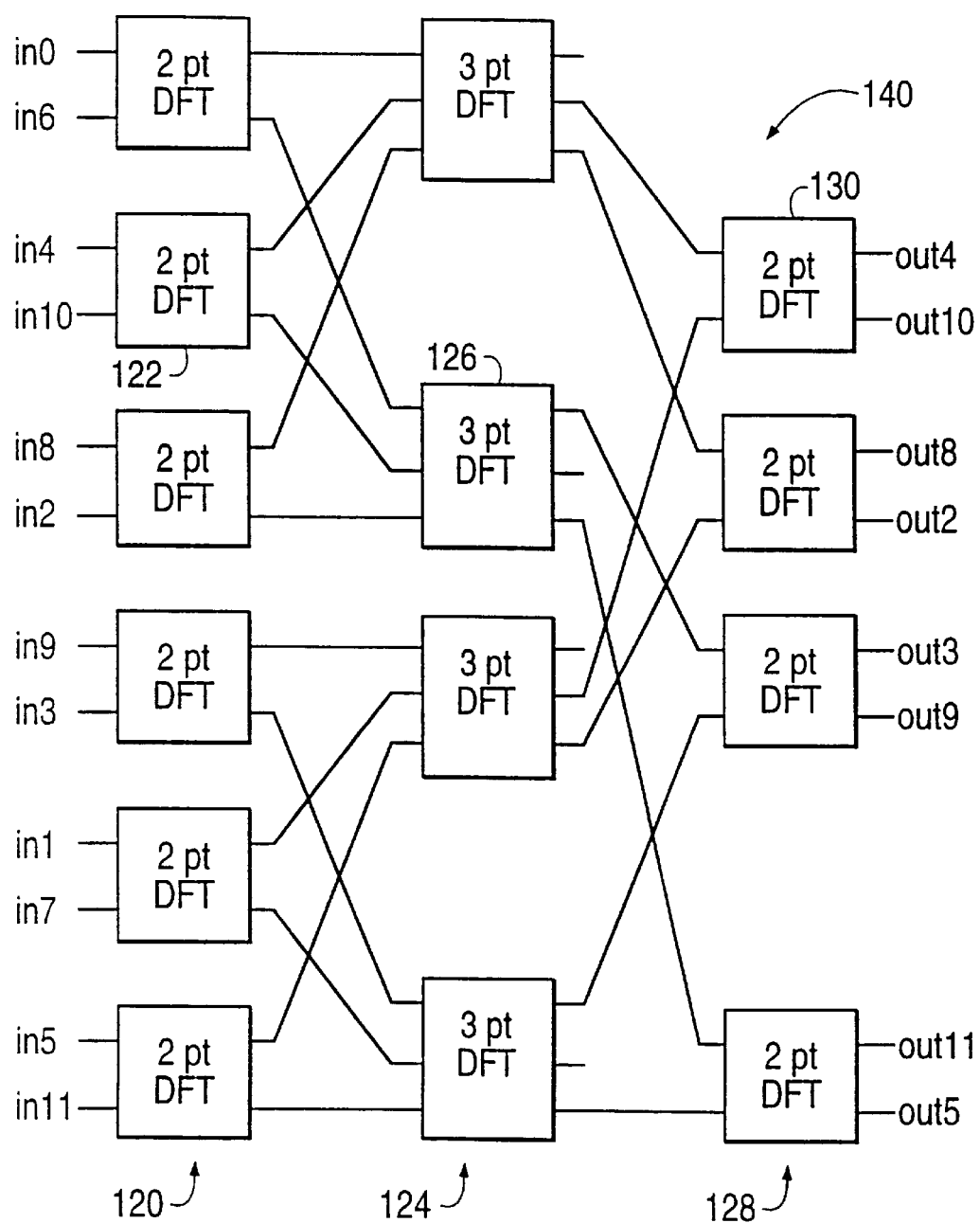
FIG. 9 illustrates a prior art pruning of the discrete Fourier transform apparatus of FIG. 8.

FIG. 17 illustrates a preferred embodiment 202 of distributed arithmetic which may be used with the practice of the present invention. However, it should be understood that the present invention is not limited to the use of distributed arithmetic in the practice of the window presum computer 102 of the present invention nor to the preferred embodiment of distributed arithmetic of FIG. 17. The prior art of FIG. 5 is a possible implementation for calculating y(i) without distributed arithmetic.

The inputs $x_0$, $x_1$, $x_2$, and $x_3$ represent eight bit words which are inputted to the individual distributed arithmetic functions or circuits 202 of FIGS. 14–16. A number of parallel processing paths 203, equal to the number of bits within each word $x_0$, $x_1$, $x_2$, and $x_3$, perform the calculations which are summed as the quantity y(i) which is the output from each of the distributed arithmetic functions or circuits 202. Each processing path 203 is comprised of logic 52, distributed arithmetic ROM 54 and shifter 56 which perform functions analogous to the prior art of FIG. 6 but accomplish all processing within one clock cycle instead of with multiple clock cycles as in FIG. 6. Each processing path 203 processes a single different bit slice from the R input data words outputted from the registers of FIGS. 14–16. As illustrated in FIG. 17, eight different bit slices are processed respectively during one clock cycle by the different processing channels 203.

The logic functions 52 reduce the number of bits by one which are inputted as addressing bits to the distributed arithmetic ROMs 54 which output a precalculated sum of the coefficients which is addressed by the bits within the bit slice of each of the bits of the bit slice. The shifter 56 multiplies the output by the weighting factor $2^n$ or $2^{-n}$ to output the correct total for the position of the particular bit slice, e.g. paths 0–7 to the carry save adder 65 which outputs the total y, representing the individual outputs y(i) of each of the distributed arithmetic functions or circuits 202 of FIGS. 14–16.

The distributed arithmetic architecture 202 of FIG. 17 has substantial advantages in an environment which has processing constraints such as a satellite application. The use of only parallel processing for each bit slice (e.g. 0–7) reduces the system clock rate which permits circuits such as CMOS to be used, which is a preferred integrated circuit implementation for reducing power consumption in integrated circuits used in accordance with the present invention. The use of CMOS and other integrated circuit technologies which lower power consumption can provide increased processing capability by lowering operating temperature of the integrated circuits. Furthermore, fewer gates are required to implement the distributed arithmetic 202 of FIG. 17 in comparison to the prior art of FIG. 5.

Figure 11:
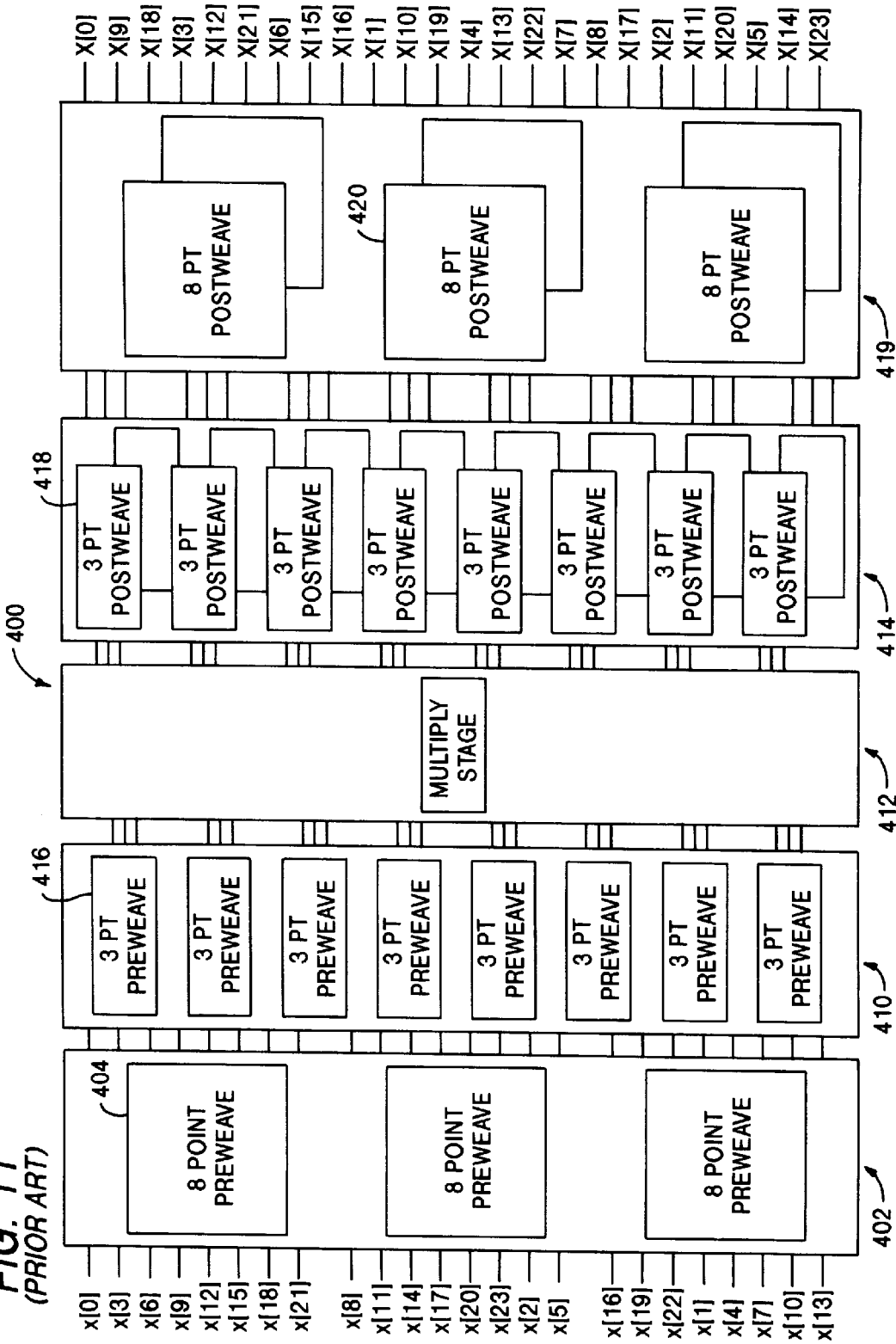
FIG. 11 illustrates a third type of prior art discrete Fourier transform apparatus.
Figure 18:
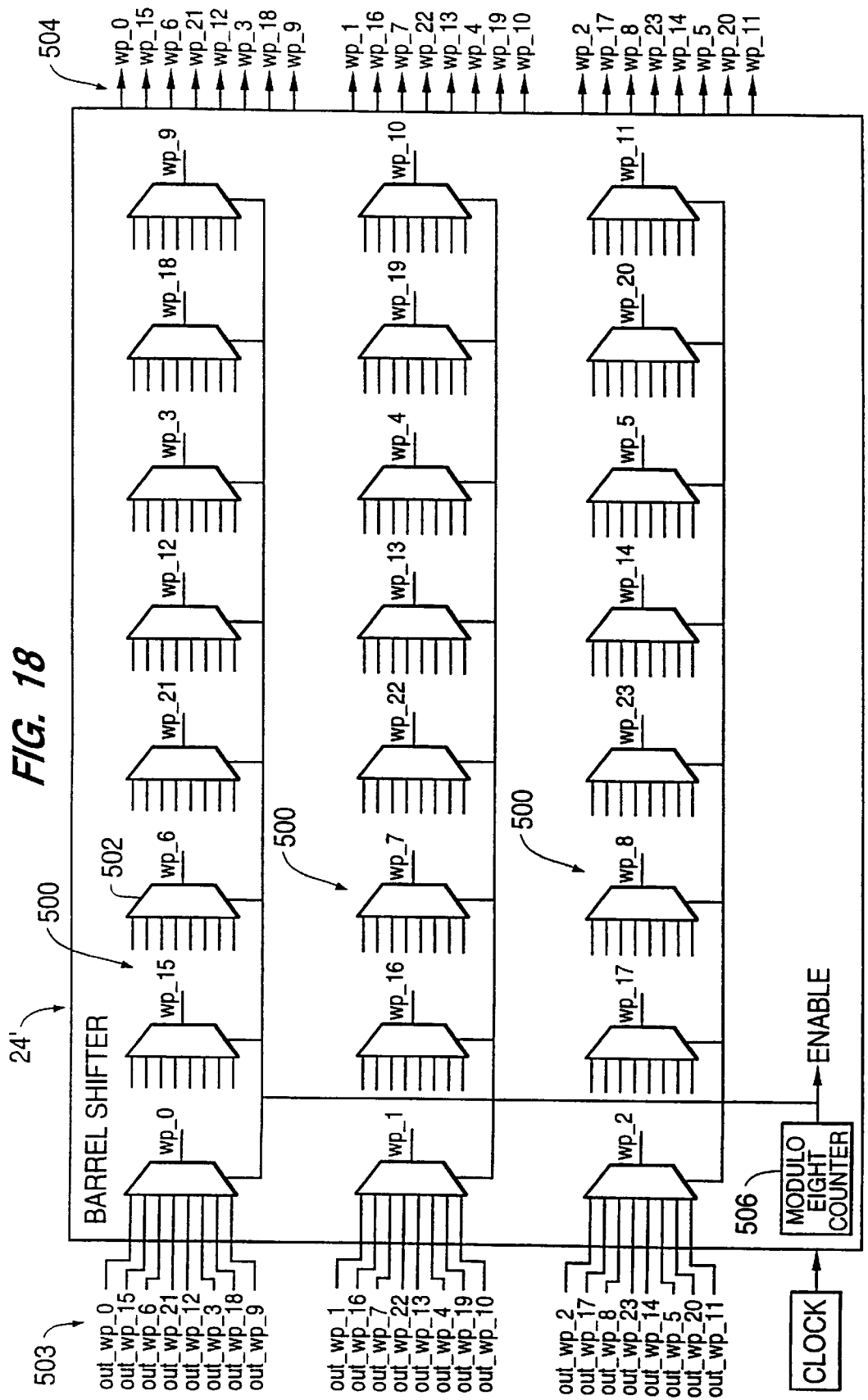
FIG. 18 illustrates a block diagram of a preferred embodiment of a cyclic shift in accordance with the present invention.

FIGS. 18 and 19 illustrate the implementation of a preferred embodiment of the cyclic shift 24' used in a digital channelizer in accordance with the invention in which divides an input bandwidth into at least some of equally spaced N channels. The cyclic shifting function of the present invention performs the same function as in the prior art but is implemented in a modular architecture of integrated circuits, such as CMOS, in a parallel data processing architecture. The cyclic shift 24', as illustrated in FIG. 18, includes I parallel cyclic shifting paths which are identical in number to the I window presum circuits utilized in a preferred embodiment of a window presum computer 102 in accordance with the present invention. The use of same number of parallel processing paths in the window presum computer 102 and in the cyclic shift 24' permits a highly efficient interconnection between the window presum computer 102 and the cyclic shift which increases the efficiency of the cyclic shift 24' and substantially reduces power consumption in a digital channelizer in a satellite application, such as a multibeam regenerative wideband satellite system. Each cyclic shift path 500 is responsive to a different input group of data words which correspond to the data words outputted by the window presum computer in I (three) groups as illustrated in FIG. 13. The I cyclic shift paths 500 produce I output groups of data words 504 as illustrated on the right hand side of FIG. 18. The outputs of data words 504 from the cyclic shift paths 500 are inputs to the discrete Fourier transform apparatus used in practice of the present invention which may be in accordance with the prior art of FIG. 11 or in accordance with the discrete Fourier transform apparatus of FIG. 21 which prunes certain outputs from the output Fourier transform computation stage 419 where all frequency domain outputs are not necessary for subsequent processing into channels by the channelizer. Each cyclic shift path 500 has a number of barrel shifters 502 which is equal to the number of inputs thereto, from the corresponding window presum circuit 200 of the window presum computer 102. The inputs to each of the barrel shifters 502 to the right of the barrel shifters having the outputs wp-0, wp-1 and wp-2 in each of the I cyclic shift paths 500 are rotated one position so that the identified output represents the top input but the order of the inputs is unchanged. For example, the barrel shifter 502 having the output wp-15 has its inputs out-wp from top to bottom in the order 15, 6, 21, 12, 3, 18, 9 and 0 and the barrel shifter immediately to the right has its inputs out-wp in the order 6, 21, 12, 3, 18, 9, 0, 15.

The number of cyclic shift paths is equal to GCD(N,M). Each output group 504 of data words is shifted through a number of cycles Q equal to N/GCD(N,M). The number of cycles used by the cyclic shift 24', e.g. 8, determines the number of outputs of the window presum circuits 202 which are grouped together and permits direct mapping of interconnections from the window presum circuits 200 into the parallel cyclic shift paths 500. Each cycle has a shift value defined by mM*modulo N or −mM*modulo N with m varying from zero to Q-1. The foregoing number of cycles and shift values produce an efficient cyclic shift 24' of a parallel architecture which has inputs which efficiently map to the outputs of the window presum circuits 102 and into the inputs of the discrete Fourier transform apparatus 26' without complex interconnections.

FIG. 19 illustrates a table containing the various cycle values for the eight cycles through which each of the word outputs of the barrel shifters 502 are shifted in each of the cyclic shift paths 500. The headings 0–23 respectively indicate for each of the eight cycles the output value of the barrel shifters 502 identified by the headings 0–23 which are the input words to individual cyclic shift paths 500 to the left in FIG. 18. As may be seen, the parallel cyclic shift paths 500 from top to bottom respectively have input words in a first group of 0, 15, 6, 21, 12, 3, 18 and 9, in a second group of 1, 16, 7, 22, 13, 4, 19 and 10 and in a third group of 2, 17, 8, 23, 14, 5, 20 and 11. The first group of 0, 15, 6, 21, 12, 3, 18 and 9 represents the calculated result of mM modulo N for M equalling 15, N equalling 24 and m varying from 0 to 7. When the outputs of the window presum computer 102 produced by the window presum circuits 200 are chosen in this order, the interconnection between the window presum computer 102 and the cyclic shift 24' is simplified. The choice of the order of the words in the second and third groups is in accordance with the same sequence as used in the first group except that each word value is augmented by one in group two relative to group one and is augmented by two in group three relative to group one. Therefore, the required relative shifting of the output between subsequent words in each group is identical and is maintained which permits the shifting of the parallel cyclic paths 500 to be driven by a modulo eight (3 bit) counter 506 toggled at the clock rate.

As illustrated with the outputs 504 from the cyclic shift 24' it is possible to enable the cyclic shift outputs to efficiently map into the inputs of the discrete Fourier transform apparatus 26' such as in FIG. 21. The cyclic shift paths 500 produce outputs that are independent of a first stage discrete Fourier transform which allows hardware design replication in a parallel architecture. This efficient mapping occurs when the first discrete independent Fourier transform computation stage contains GCD(N,M) discrete Fourier transforms each having Q input points and the prime factor algorithm is used which causes the ordering of the discrete Fourier transform to be such that the outputs 504 may be mapped with simple interconnection into the inputs of the discrete Fourier transform such as that illustrated in the prior art of FIG. 11 and the pruned discrete Fourier transform described below in conjunction with FIG. 21. Other efficient mappings may offer similar simple interconnection characteristics.

The actual output values in FIG. 19 for each of the barrel shifters identified by the headings 0–23 of the cyclic shift paths 500 are obtained by identifying the particular shift cycle of the repeating cycles 1–8. Therefore, it is seen that the barrel shifter identified with the heading 15 sequentially for cycles 1–8 outputs inputs identified by out_wp 15, 6, 21, 12, 3, 18, 9 and 0, respectively.

The individual cyclic shift paths 500 contain Q barrel shifters 502 which function as word shifting elements. Each barrel shifter 502 is responsive to an identical group of input words 503 identified by the legend "out_wp" followed by a number and outputs only a single word at a time. The present invention is not limited to barrel shifters to implement the cyclic shift 24' with any circuit or process which can output the word values for the cycle inputs of FIG. 19 being usable in the practice of the invention.

Figure 10:
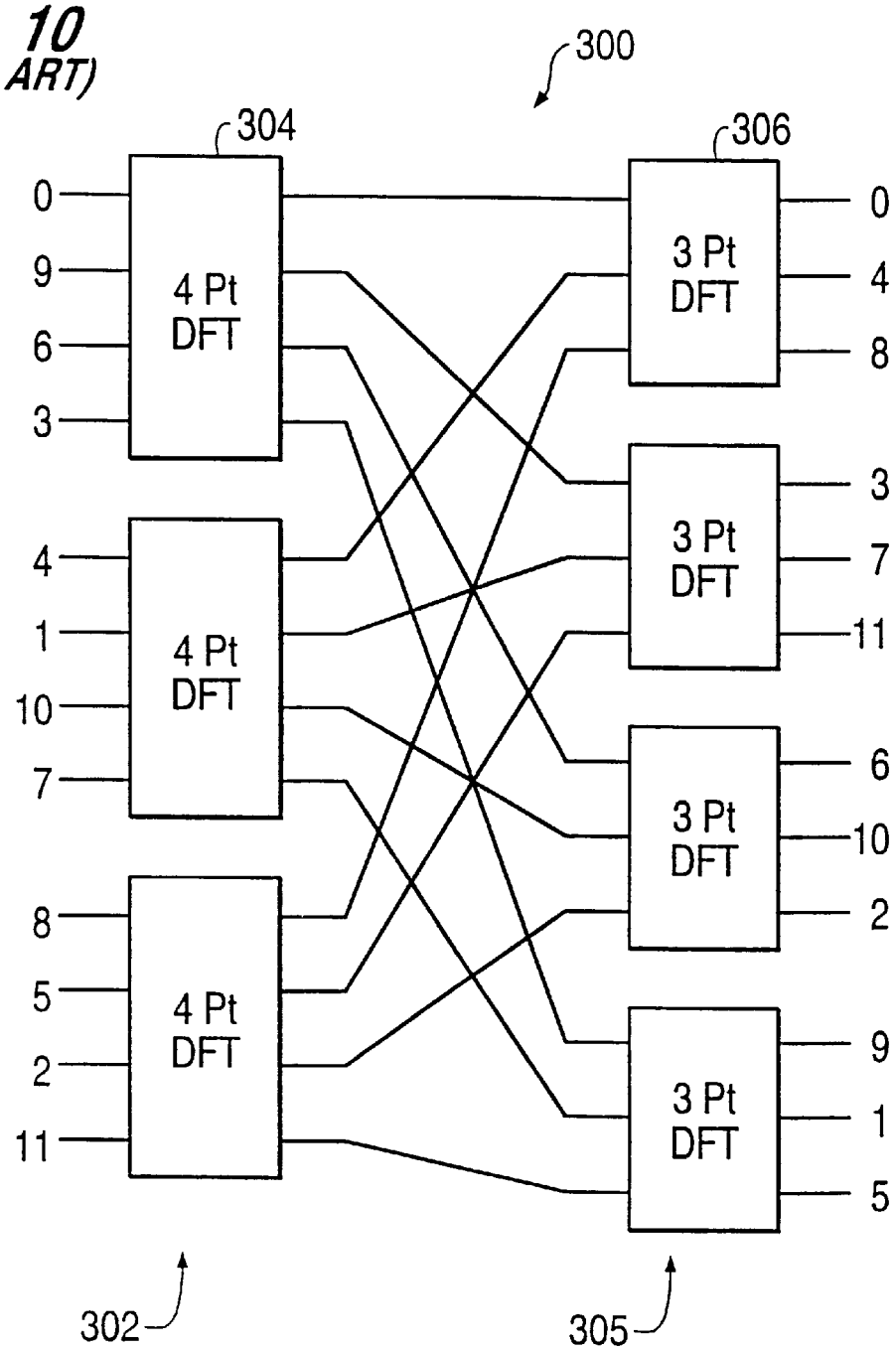
FIG. 10 illustrates a second type of prior art discrete Fourier transform apparatus.

FIG. 20 illustrates a first embodiment 600 of a pruned discrete Fourier transform apparatus in accordance with the present invention which represents a modification of the prior art discrete Fourier transform of FIG. 10. Pruning results in the number of actual outputs P of the discrete Fourier transform being less than a possible number of outputs. Pruning of a discrete Fourier transform reduces computational complexity both in terms of logic complexity and interconnection complexity. Furthermore, pruning also reduces power consumption. Any operations used to generate inputs to the pruned portion of the discrete Fourier transform apparatus can be eliminated from the input discrete Fourier transform stage.

Figure 3A:
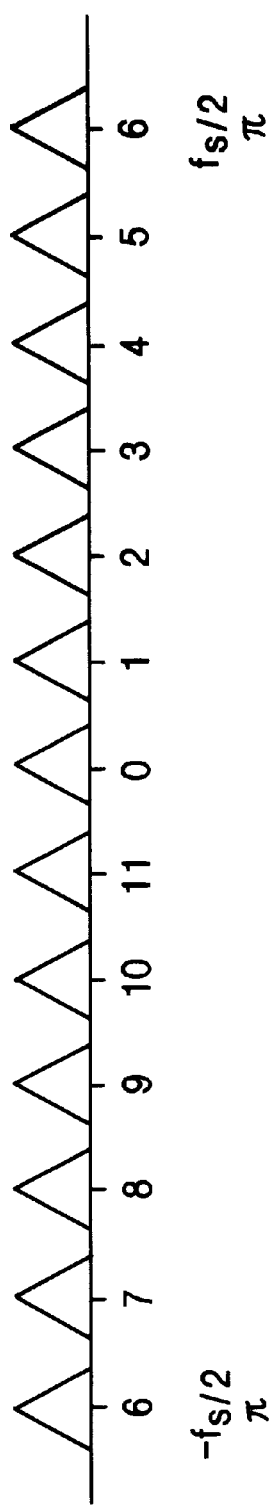
FIGS. 3A and 3B respectively illustrate frequency domain signals produced by digital sampling of wideband signals in accordance with the prior art.

The discrete Fourier transform apparatus 600 represents the circumstance where only output frequency domain signals 2, 3, 4, and 5 are required for subsequent processing from inputs from the cyclic shift 24'. The three point DFT 306' which contains an "X" is unnecessary in view of output frequency domain signal 7 being used in place of frequency domain signal 5 for processing by processing device 602 which represents any downstream processing of the discrete Fourier transform including, but not limited to, applications in a digital channelizer. For real input signals frequency domain signal 7 is a conjugate of frequency domain signal 5, which is not provided in an output of the three remaining three point discrete Fourier transforms 306. However, because frequency domain signal 7, as illustrated in FIG. 3A, is a conjugate of frequency domain signal 5, which is not present in the output from the discrete Fourier transform apparatus 600, a sign negation of the imaginary part of the frequency domain signal 7 permits the information of frequency domain signal 5 to be recovered and available for downstream processing while permitting the discrete Fourier transform apparatus output(s) to be simplified which has the above-stated advantages.

A discrete Fourier transform apparatus in accordance with the invention has at least one discrete Fourier transform computation stage. However, in a preferred embodiment the discrete Fourier transform includes multiple computation stages 302 and 305', as illustrated in FIG. 20, and, 402, 410, 412, 414 and 419 as illustrated in FIG. 21, as discussed below. While the example illustrated in FIG. 20 represents only the use of frequency domain signal 7 in place of frequency domain signal 5, it should be understood that each of the N inputs which have conjugates (e.g. frequency domain signals 0 and N/2 (for even N) do not have conjugates) may be represented in the output by its conjugate which is subsequently processed in place of the frequency domain signal which is not an actual output. Furthermore, at least one processing device 602 may be used to process at least one conjugate as representative of one of the input signals.

Figure 3B:
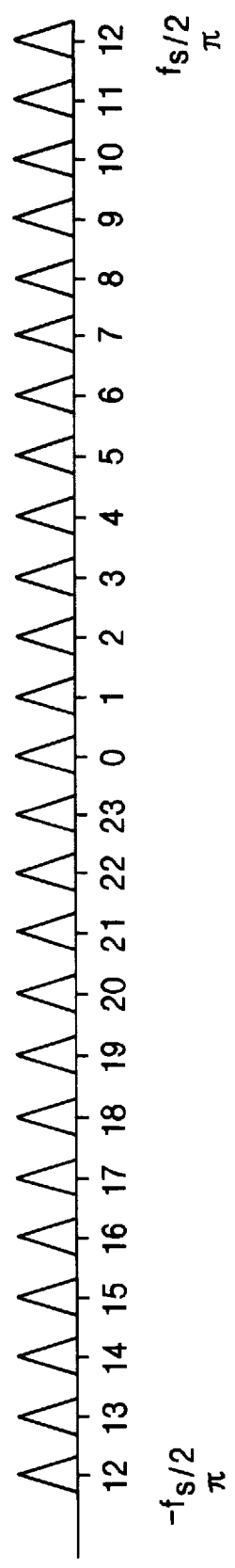

FIG. 21 illustrates another embodiment of a discrete Fourier transform apparatus 700 in accordance with the present invention in which two conjugates of the frequency domain signals illustrated in FIG. 3B are processed as representative of inputs. The difference between the prior e art of FIG. 11 and the discrete Fourier transform apparatus 700 resides in the elimination of one of the eight point postweaves 420 which permits channels X[16] and X[19] to be used in place of their conjugate frequency domain signals X[8] and X[5] which are not outputs in view of the elimination of the third eight point postweave 420 contained in FIG. 11. The processing devices 702 process the transformation of the plurality of conjugates of the twenty-four inputs, which are not transformed into an actual output, in place of the plurality of the twenty-four inputs which are not transformed into an actual output. As a result, the overall structure of the discrete Fourier transform apparatus 700 is simplified in that the output discrete Fourier transform computation stage has an eight point postweave 420 pruned therefrom which lessens power consumption and further reduces the amount of hardware in an application where all of the twenty four possible output channels in a channelizer are not required.

FIG. 22 illustrates a modification of the circular shift 24' and discrete Fourier transform apparatus 26' as illustrated in FIG. 12 under the control of an input command specifying the processing of real or complex data. The command permits real word inputs or complex word inputs to be transformed into channel outputs of a channelizer without external modification of the cyclic shifts 24' and the discrete Fourier transform 26'. In the left-hand portion of FIG. 22, the headings "complex" and "real" respectively identify the selective inputting of twelve data points. The data listed under the heading "complex", signify the real and imaginary parts of six words and, the data listed under the heading "real", signify the real data of twelve input words.

The cyclic shift 24' is comprised of twelve barrel shifters (multiplexers) 700 which receive inputs that correspond to the data under the "real" heading. However, it should be understood that if complex data is being inputted, that that data is identified by the words "w0$_r$" through "w5$_i$". The actual input values are either represented by the imaginary or real component of complex data or real data. The barrel shifters 700 have outputs which, depending upon the particular barrel shifter, are either coupled directly to a two point discrete Fourier transform 702 or an input to switch 704. The switches 704 each have at least one input receiving real data as identified by the words W4, W10, W8, W2, W9, W3, W1, and W7 and at least one input receiving a component of complex data as identified by inputs W4$_r$, W1$_r$, W2$_r$, W5$_r$, W0$_i$, W3$_i$, W4$_i$ and W1$_i$. The input to each of the switches 704, REAL/COMPLEX SELECT is a command which specifies processing of the cyclically shifted real data or the cyclically shifted complex data outputted to the barrel shifters 700 by the cyclic shift 24'. The discrete Fourier transform apparatus 26' is comprised of an input discrete Fourier computation stage 720 comprised of six two-point discrete Fourier transforms 702 and four three-point discrete Fourier transforms 706 and an output stage 728 comprised of six two-point discrete Fourier transforms/recombines 708. In real processing mode, the two point discrete Fourier transforms/recombines 708 function as two point discrete Fourier transforms and as two point recombines in complex mode. The individual outputs from the output stage 728 are always complex data but, depending upon whether the REAL/COMPLEX SELECT command specifies the processing of real or complex data, the number and order of complex outputs is changed.

The architecture of the cyclic shift 24' and the discrete Fourier transform apparatus 26' of FIG. 22 permits modular construction in diverse applications in which it is desirable to selectively input to discrete Fourier transform apparatus 26' either real or complex data outputs from a window presum computer 102 without having to modify the cyclic shift 24' and discrete Fourier transform apparatus 26'. The only variable in the operation of FIG. 22 is the command REAL/COMPLEX SELECT to transform the inputs to the cyclic shift 24' as either real data or complex data. A universal architecture for discrete Fourier transforming of real or complex data may be implemented in integrated circuits to process data in parallel processing architectures such as that of the present invention. While FIG. 22 is illustrated as processing as inputs the output from a twelve point window presum calculation, it should be understood that the configuration of FIG. 22 may be modified to parallel architectures, such as the eight point processing of the parallel channels described above.

The following relationships exist for the discrete Fourier transform apparatus 26' of FIG. 22. N is a multiple of two. The N point discrete Fourier transform apparatus 26' includes an input discrete Fourier computation stage 724 which is required to have two N/2 point Fourier transforms 702 and an output discrete Fourier computation stage 728 which is required to have N/2 two-point discrete Fourier transforms/recombines 708. The two point discrete Fourier transforms/recombines 708 are two point discrete Fourier transforms in real mode and two point recombines in complex mode as described in more detail below. The architecture of the discrete Fourier transforms/recombines 708 as two point structures enables them to function in real and complex mode.

In order to permit operations in real and complex mode, the discrete Fourier transforms/recombines 708 contain identical hardware. The discrete Fourier transform/recombine 708 functions in a configurable manner which configuration depends upon the type of data being processed and the location in the output discrete Fourier transforms stage 728 in FIG. 22.

Real processing is illustrated in FIG. 23 during which only real data is subjected to discrete Fourier transformation.

In a complex data processing mode, as illustrated in FIG. 24, one complex input is combined from the N/2 point discrete Fourier transforms 702 that process the "real" inputs, while the other complex input will come from the N/2 point discrete Fourier transforms 702 that process the "imaginary" inputs. The "imaginary" value must be multiplied by j (equivalent to i mathematically). Then, the individual components of the "real" and "imaginary" values are added to achieve the final output.

In the implementation of the twelve point discrete Fourier transform apparatus 26' (in the 2-3-2 architecture), the outputs of one of the three point discrete Fourier transforms 706 requires a multiplication by –j (a twiddle factor) prior to the final two point discrete Fourier transform/recombine 708. This multiplication operation is performed by the two point discrete Fourier transform/recombine 708 as shown in FIG. 25 as (real case-special).

The bottom three two-point discrete Fourier transform/recombines 708 in FIG. 22 (which have their lower input from the bottom-three point discrete Fourier transforms 706), provide a multiplication by –j in the case of real data processing.

The design of the two point discrete Fourier transforms/recombines 708 must incorporate all possible operations, including two point discrete Fourier transform, two point discrete Fourier transform with –j multiplication, and two point complex recombine function. A high level diagram of a discrete Fourier transform 708 performing all of these functions is illustrated in FIG. 26 and shows that all output combinations are attainable.

While the invention has been defined in terms of preferred embodiments, it should be understood that numerous modifications may be made thereto without departing from the spirit and scope of the present invention. It is intended that all such modifications fall within the scope of the appended claims.

What is claimed is:

1. A digital channelizer which divides an input bandwidth into at least some of N channels comprising:
   a window presum, responsive to input data, which outputs real or complex data;
   a cyclic shift, coupled to the real or complex data outputted from the window presum, which outputs real or complex data which is cyclic shifted relative to data outputted from the window presum; and
   an N point discrete Fourier transform apparatus, coupled to the shifted real or complex data, which in response to a command performs a discrete Fourier transform on inputted cyclic shifted real or inputted cyclic shifted complex data to produce the channels, the discrete Fourier transform apparatus performing a transformation of the inputted cyclic shifted real data when the command specifies processing of the inputted cyclic shifted real data and performing a transformation of the inputted cyclic shifted complex data when the command specifies processing of the inputted cyclic shifted complex data and wherein
   the N point discrete Fourier transform includes an input discrete Fourier computation stage having two N/2 point discrete Fourier transforms having inputs coupled to outputs of the cyclic shift and a plurality of outputs and an output discrete Fourier computation stage having N/2 two point discrete Fourier transforms having a plurality of inputs coupled to outputs of different ones of the two N/2 point discrete Fourier transforms of the input discrete Fourier computation stage and a plurality of outputs which are different ones of the channels.

2. A digital channelizer in accordance with claim 1 further comprising:
   a plurality of switches each having a plurality of inputs with at least one input receiving real data from the cyclic shift and at least one input receiving a component of complex data for the cyclic shift with each of the switches being responsive to the command to input the real data to the discrete Fourier transform apparatus or to input the complex data to the discrete Fourier transform apparatus; and
   when the command specifies processing of real data, the discrete Fourier transform apparatus outputs a transformation of real data and when the command specifies processing of complex data, the discrete Fourier transform apparatus outputs a transformation of complex data.

3. A digital channelizer in accordance with claim 2 wherein each of the switches comprise:
   a multiplexer, which is responsive to the command, which selectively outputs real data or a component of complex data to the at least one input discrete Fourier computation stage.

4. A system comprising:
   a plurality of inputs which provide real data or complex data;
   an N point discrete Fourier transform apparatus, coupled to the plurality of inputs, which provides a multiple point discrete Fourier transform of the plurality of inputs, and is responsive to a command to transform the real or complex data to output transformed real data when real data are provided to the inputs and the command specifies transforming real data and to output transformed complex data which have been processed when complex data are provided to the inputs and the command specifies transforming complex data; and
   wherein the discrete Fourier transform apparatus includes
   an input discrete Fourier computation stage having two N/2 point discrete Fourier transforms having inputs and a plurality of outputs and an output discrete Fourier computation stage having N/2 two point discrete Fourier transforms having a plurality of inputs coupled to outputs of different ones of the two N/2 point discrete Fourier transforms of the input discrete Fourier computation stage and a plurality of outputs which are different ones of the channels.

5. A system in accordance with claim 4 further comprising:
   a plurality of switches each having a plurality of inputs with at least one input receiving real data and at least one input receiving a component of complex data with each of the switches being responsive to the command to input the real data to the multiple point discrete Fourier transform apparatus to input the complex data to the multiple point discrete Fourier transform apparatus.

6. A process for dividing an input bandwidth into at least some of N channels comprising:
   providing a window presum having N outputs of real or N/2 outputs of complex data containing a real component and an imaginary component with each output being a function of a window presum function;
   cyclic shifting the outputs produced by the window presum to produce shifted real or complex data; and
   providing an N point discrete Fourier transform including an input discrete Fourier computation stage having two N/2 point discrete Fourier transforms and an output discrete Fourier computation stage having N/2 two point discrete Fourier transforms which perform a discrete Fourier transform on the cyclic shifted, real or complex data in response to a command to produce an output transformation of real or an output of complex data comprising a transform of real data when the command specifies transforming real data and the cyclic shifted data are real data and comprising a transform of complex data when the command specifies transforming of complex data and the cyclic shifted data are complex data.

7. A process in accordance with claim 6 further comprising:
   providing a plurality of switches each having a plurality of inputs with at least one input receiving shifted real data and at least one input receiving a shifted component of complex data with each of the switches being responsive to the command to output the real data to the N point discrete Fourier transform or to output the complex data to the N point discrete Fourier transform.

8. A process for performing a discrete Fourier transform of real or complex data comprising:

provinding an N point discrete Fourier transform including an input discrete Fourier computation stage having two N/2 point discrete Fourier transforms and an output discrete Fourier computation stage having N/2 two point discrete Fourier transforms which transform a plurality of input signals containing either the real data or the complex data; and performing a discrete Fourier transform with the N point discrete Fourier transform, in response to a command, on the real or complex data to produce a transform of the real data when the command specifies transformation of real data and the inputted data is real data and to produce a transform of complex data when the command specifies transformation of complex data and the inputted data is complex data.

9. A process in accordance with claim 8 further comprising:

providing a plurality of switches each having a plurality of inputs with at least one input receiving real data and at least one input receiving a component of complex data with each of the switches being responsive to the command to output the real data to the N point discrete Fourier transform or to output the complex data to the N point discrete Fourier transform.

* * * * *